(12) United States Patent
Vogel et al.

(10) Patent No.: US 11,333,728 B2
(45) Date of Patent: *May 17, 2022

(54) PRE-POLARISATION MAGNET ARRANGEMENT

(71) Applicant: THE UNIVERSITY OF QUEENSLAND, St Lucia (AU)

(72) Inventors: Michael Werner Vogel, Petrie (AU); David Charles Reutens, Chelmer (AU); Andrea Giorni, Highgate Hill (AU); Ruben Pellicer-Guridi, Yeronga (AU); Viktor Vegh, Holland Park (AU)

(73) Assignee: THE UNIVERSITY OF QUEENSLAND, St Lucia (AU)

( * ) Notice: Subject to any disclaimer, the term of this patent is extended or adjusted under 35 U.S.C. 154(b) by 0 days.

This patent is subject to a terminal disclaimer.

(21) Appl. No.: 16/604,971

(22) PCT Filed: Apr. 13, 2017

(86) PCT No.: PCT/AU2017/050337
§ 371 (c)(1),
(2) Date: Oct. 11, 2019

(87) PCT Pub. No.: WO2018/187826
PCT Pub. Date: Oct. 18, 2018

(65) Prior Publication Data
US 2020/0072926 A1  Mar. 5, 2020

(51) Int. Cl.
*G01R 33/44* (2006.01)
*G01R 33/383* (2006.01)
*G01R 33/389* (2006.01)

(52) U.S. Cl.
CPC ......... *G01R 33/445* (2013.01); *G01R 33/383* (2013.01); *G01R 33/389* (2013.01)

(58) Field of Classification Search
CPC ... G01R 33/445; G01R 33/383; G01R 33/389
See application file for complete search history.

(56) References Cited

U.S. PATENT DOCUMENTS 6,489,872 B1 * 12/2002 Fukushima .......... G01R 33/383
                                                 335/216
9,910,115 B2 *  3/2018 Wald .................... G01R 33/383
(Continued)

FOREIGN PATENT DOCUMENTS

| WO | 2005/047916 A1 | 5/2005 |
| WO | 2008/065389    | 6/2008 |
| WO | 2008/065389 A1 | 6/2008 |

OTHER PUBLICATIONS

International Preliminary Report on Patentability and Written Opinion of the International Searching Authority dated Oct. 15, 2019, issued in International Application No. PCT/AU2017/050337.
(Continued)

*Primary Examiner* — Dixomara Vargas
(74) *Attorney, Agent, or Firm* — Nixon & Vanderhye P.C.

(57) ABSTRACT

A pre-polarisation magnet arrangement for generating a pre-polarisation field for use in a low field magnetic resonance imaging process, the pre-polarisation magnet arrangement including a pre-polarisation field array including a plurality of permanent pre-polarisation magnets mounted in a support and provided in a circumferentially spaced arrangement surrounding an field of view, a number of the pre-polarisation magnets being movable between respective first and second positions, wherein in the first position the pre-polarisation magnets are configured as a cylindrical Halbach array to generate a pre-polarisation field in the field of view and in the second position the pre-polarisation magnets are configured to minimize the pre-polarisation field in the field of view.

11 Claims, 13 Drawing Sheets

(56) References Cited

U.S. PATENT DOCUMENTS

| | | | |
|---|---|---|---|
| 10,359,481 B2* | 7/2019 | Wald | A61B 5/055 |
| 2014/0111202 A1* | 4/2014 | Wald | G01R 33/383 |
| | | | 324/309 |
| 2015/0177343 A1* | 6/2015 | Wald | G01R 33/46 |
| | | | 324/309 |
| 2020/0305758 A1* | 10/2020 | McDaniel | A61B 5/055 |

OTHER PUBLICATIONS

Baun, Olga, et al., "Permanent magnet system to guide superparamagnetic particles," Journal of Magnetism and Magnetic Materials, Feb. 2017, 37 pages.

Vogel, Michael W., et al. "Rotatable Small Permanent Magnet Array for Ultra-Low Field Nuclear Magnetic Resonance Instrumentation: A Concept Study," PLoS ONE, Jun. 6, 2016, vol. 11, No. 6, 24 pages.

U.S. Appl. No. 16/604,738, filed Oct. 11, 2019.

International Search Report for PCT/AU2017/050337, dated Jul. 25, 2017, 4 pages.

Written Opinion of the ISA for PCT/AU2017/050337, dated Jul. 25, 2017, 5 pages.

Vogel et al., "Rotatable Small Permanent Magnet Array for Ultra-Low Field Nuclear Magnetic Resonance Instrumentation": A Concept Study, *PloS one* 11.6, Jun. 6, 2016.

\* cited by examiner

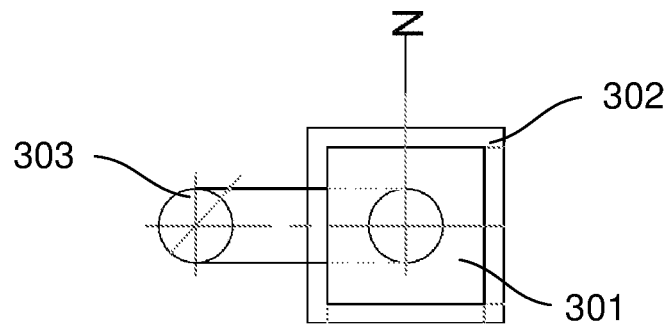
Fig. 3A
Fig. 3B
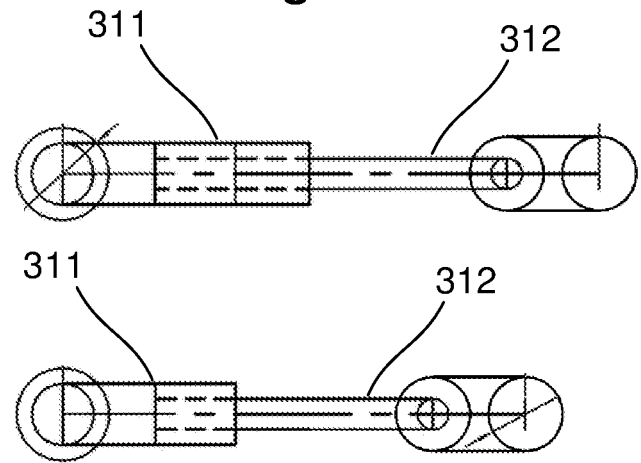
Fig. 3C

Fig. 10A
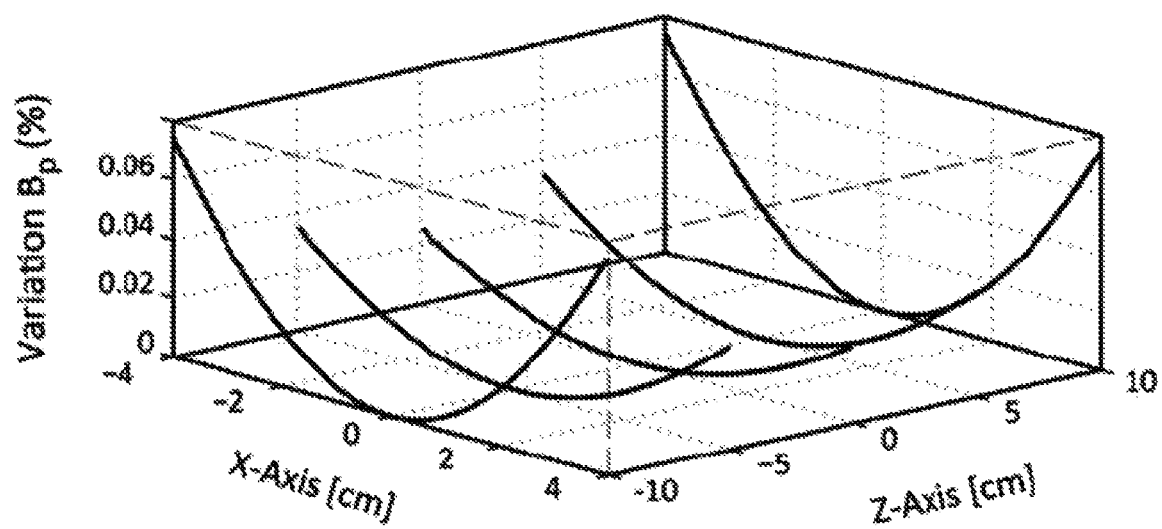
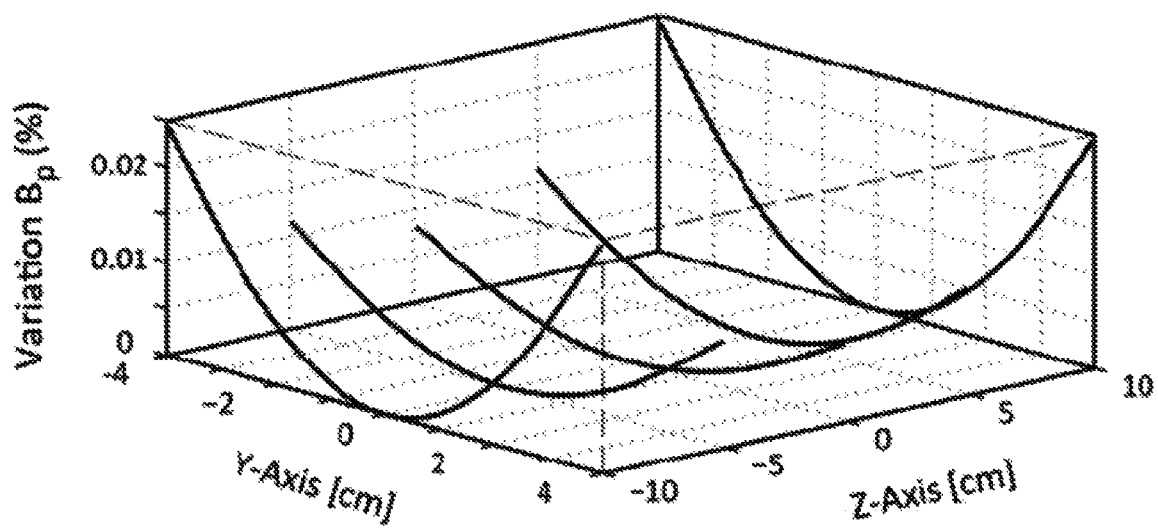
Fig. 10B

PRE-POLARISATION MAGNET ARRANGEMENT

This application is the U.S. national phase of International Application No. PCT/AU2017/050337 filed Apr. 13, 2017 which designated the U.S., the entire content of which is hereby incorporated by reference.

BACKGROUND OF THE INVENTION

The present invention relates to a pre-polarisation magnet arrangement for use in ultra-low field magnetic resonance process.

DESCRIPTION OF THE PRIOR ART

The reference in this specification to any prior publication (or information derived from it), or to any matter which is known, is not, and should not be taken as an acknowledgment or admission or any form of suggestion that the prior publication (or information derived from it) or known matter forms part of the common general knowledge in the field of endeavour to which this specification relates.

Nuclear magnetic resonance (NMR) spectroscopy and magnetic resonance imaging (MRI) are non-invasive and non-destructive investigative tools that can provide information from the molecular to the macroscopic scale. These techniques harness the phenomenon of magnetic resonance due to the interaction, within a magnetic field, between precessing nuclear magnetic moments (nuclear spin systems) and electromagnetic radiation. NMR/MRI have a wide range of applications in materials science, structural biology, chemistry and medical imaging.

Conventional MRI instruments comprise three main components: a superconducting magnet to align the nuclear spins and generate net sample magnetisation; a transmitter/receiver coil system that radiates electromagnetic energy to the nuclear spin system and detects the NMR signal; and gradient coils that enable the encoding of spatial information allowing the generation of three dimensional images.

The signal-to-noise ratio (SNR) achieved in NMR/MRI is proportional to the magnitude of net sample magnetisation. Hence, the quality of NMR/MRI data is dependent on the field strength of the main magnetic field, commonly referred to as the $B_0$ field. Additionally, as well as field strength, the homogeneity of the $B_0$ field is important in ensuring the quality of the resulting data. Superconducting magnets have been utilised to achieve high field strength. These increase the bulk and cost of purchase, operation and maintenance of NMR/MRI instruments because of cryogenic technology required.

Partly in response to these drawbacks, over the last decade there has been growing interest in ultra-low magnetic field (ULF) NMR/MRI, which uses a main magnet field strength of less than 10 mT. Potential advantages of ULF over high field NMR/MRI instruments include greater absolute magnetic field homogeneity, simple and low cost instrumentation and low power consumption. ULF NMR/MRI offers the possibility of important new applications such as the ability to image in the presence of metal, for example in trauma, disaster and battlefield applications. At ULF, the Larmor frequency overlaps with a range of molecular and physiological processes such as protein folding, slow diffusion, molecular tumbling and enzyme catalysis which are difficult to observe at high field because of the large frequency mismatch. This raises the possibility of new imaging paradigms sensitised to these processes. In addition, because superconducting magnets are not required, the instruments may be more portable, allowing ULF instruments to be used in remote locations.

Although based on the same fundamental principles of magnetic resonance as high field NMR/MRI, ULF instruments are set up differently. Prior to the measurement, sample magnetisation is generated by a pulsed magnetic field approximately three orders of magnitude higher (~0.05-0.1 T) than the Earth's field. This technique is known as sample pre-polarisation and is a key strategy in ULF research to overcome low SNR which still severely restricts ULF-NMR/MRI applications. Highly sensitive magnetometers are also used to increase SNR. Often, excitation pulses are not used to trigger the ULF-NMR/MRI signal. Instead, the ULF-NMR/MRI signal is generated and detected in the presence of a second magnetic field, the measurement field, which is perpendicular to the pre-polarisation field.

In most instruments, the magnetic fields in ULF-NMR/MRI instruments are generated using resistive coils, which have high power consumption and heat production, caused by irreversible energy dissipation. Moreover, the presence of highly conductive materials in resistive coils contributes to signal loss due to sample heating effects, residual coil noise, transients and eddy currents, and destructive interference effects.

SUMMARY OF THE PRESENT INVENTION

In one broad form an aspect of the present invention seeks to provide a pre-polarisation magnet arrangement for generating a pre-polarisation field for use in a low field magnetic resonance process, the pre-polarisation magnet arrangement including a pre-polarisation field array including a plurality of permanent pre-polarisation magnets mounted in a support and provided in a circumferentially spaced arrangement surrounding a field of view, a number of the pre-polarisation magnets being movable between respective first and second positions, wherein: in the first position the pre-polarisation magnets are configured as a cylindrical Halbach array to generate a pre-polarisation field in the field of view; and, in the second position the pre-polarisation magnets are configured to minimize the pre-polarisation field in the field of view.

In one embodiment in the second position the pre-polarisation magnets are arranged at least one of: in a reverse cylindrical Halbach array; tangentially; and, radially.

In one embodiment at least some of the pre-polarisation magnets are rotatably mounted to the support allowing the pre-polarisation magnets to rotate about magnet axes parallel to an array axis.

In one embodiment the magnet arrangement includes a pre-polarisation actuator system for rotating the pre-polarisation magnets between the first and second positions to thereby control the pre-polarisation field.

In one embodiment the pre-polarisation magnets are mounted in a sleeve, rotatably mounted to the support, and wherein the actuator system engages an arm extending laterally from the sleeve.

In one embodiment the arm is coupled to a piston mounted to the support so that activation of the piston causes rotation of the magnet.

In one embodiment the pre-polarisation actuator system includes mechanical coupling between the pre-polarisation magnets so that the pre-polarisation magnets are moved in synchronization.

In one embodiment the pre-polarisation actuator system includes a drive member and a mechanical linkage coupling each of the number of pre-polarisation magnets and the drive, so that each of the number of pre-polarisation magnets is rotated by a defined amount in a respective direction upon actuation of the drive.

In one embodiment the mechanical linkage includes one or more gears.

In one embodiment the drive member includes at least one of: a gear wheel; and, a rotary actuator.

In one embodiment the pre-polarisation actuator system is at least one of: pneumatically operated; hydraulically operated; manually operated; and, electrically operated using a motor to move the magnets from the second to the first position.

In one embodiment the pre-polarisation actuator system is configured to move the pre-polarisation magnets from the first to the second position at least in part using magnetic forces between the pre-polarisation magnets.

In one embodiment the pre-polarisation actuator system includes a locking system for locking the pre-polarisation magnets in the first position.

In one embodiment the actuator system has a tolerance of less than 40 arcsecond.

In one embodiment the pre-polarisation magnets are elongate permanent bar magnets extending parallel to an array axis with a remnant magnetisation orientated perpendicularly to the array axis.

In one embodiment the pre-polarisation magnets have at least one of: a cross-sectional area of at least one of: at least 5 $cm^2$; at least 6 $cm^2$; less than 10 $cm^2$; between 5 $cm^2$ and 10 $cm^2$; between 6 $cm^2$ and 9 $cm^2$; approximately 6.8 $cm^2$ to 8 $cm^2$; a length of at least one of: at least 10 cm; at least 15 cm; less than 100 cm; less than 80 cm; and, between 15 cm and 70 cm; and, a remnant field strength of at least one of: at least 0.5 T; at least 0.75 T; and, at least 1 T.

In one embodiment the pre-polarisation magnet array has at least one of: a plurality of magnets numbering at least one of: 12 magnets; 16 magnets; and, 24 magnets; and, a radius of at least one of: at least 10 cm; at least 12 cm; less than 20 cm; less than 18 cm; and, approximately 15 cm.

In one embodiment the support is a cylindrical support body having a support body axis coincident with the array axis and wherein the pre-polarisation field extends in a pre-polarisation field direction perpendicular to the array axis.

In one embodiment with the pre-polarisation magnets in the first position the pre-polarisation field has at least one of: a strength in the field of view of at least one of: at least 10 mT; at least 50 mT; and, at least 100 mT; a field inhomogeneity of at least one of: less than 230 ppm; and, less than 200 ppm.

In one embodiment in the second position the pre-polarisation field has a strength in the field of view of at least one of: less than 1 nT; less than 0.1 nT; and, less than 0.01 nT.

In one embodiment the field of view has a volume of at least one of: at least 50 $cm^3$; at least 75 $cm^3$; at least 100 $cm^3$; and at least 125 $cm^3$.

In one broad form an aspect of the present invention seeks to provide a magnet system for use in a low field magnetic resonance process, the system including: a pre-polarisation magnet arrangement for generating a pre-polarisation field, the pre-polarising magnet arrangement including a pre-polarisation field array including a plurality of permanent pre-polarisation magnets mounted in a support and provided in a circumferentially spaced arrangement surrounding a field of view, a number of the pre-polarisation magnets being rotatable between respective first and second positions, wherein: in the first position the pre-polarisation magnets are configured as a cylindrical Halbach array to generate a pre-polarisation field in the field of view; and, in the second position the pre-polarisation magnets are configured to minimize a field in the field of view; and, a measurement magnet arrangement for generating a measurement field.

In one embodiment: the pre-polarisation magnet arrangement generates a pre-polarisation field having a pre-polarisation field direction perpendicular to the array axis; and, the measurement magnet arrangement generates a measurement field having a measurement field direction perpendicular to the array axis and the pre-polarisation field direction.

In one embodiment the measurement magnet arrangement includes at least one measurement field array mounted at least one of: radially outwardly of the support; and, radially inwardly of the support.

In one embodiment the measurement magnet arrangement includes: a first measurement array including a plurality of permanent first measurement magnets mounted in a first support in a circumferentially spaced arrangement and configured to generate a first field in a field of view, the first field being orientated in a first direction relative to the first support; and a second measurement array including a plurality of permanent second measurement magnets mounted in a second support in a circumferentially spaced arrangement and configured to generate a second field in the field of view, the second field being orientated in a second direction relative to the second support, wherein the first and second supports are concentrically arranged about a field of view so that first and second measurement arrays can be relatively rotated allowing a strength of a measurement field in the field of view to be controlled.

In one embodiment: when the first and second directions are in opposition a measurement field in the field of view is minimized; and, when the first and second directions are at least partially aligned with a measurement field direction, a net measurement field is generated extending in the measurement field direction, with the strength of the measurement field being controlled by a degree of alignment of the first and second directions.

In one embodiment the first and second measurement arrays are configured as respective cylindrical Halbach arrays.

In one embodiment the measurement magnet arrangement includes mechanical coupling between the first and second measurement arrays so that the first and second measurement arrays are rotated synchronously in opposing directions.

In one embodiment the measurement magnet arrangement includes a measurement actuator system for relatively rotating the first and second permanent magnet arrays.

In one embodiment the measurement actuator system includes pistons coupled to the first and second supports.

In one embodiment the measurement actuator system includes a drive member and a mechanical linkage coupling that rotates at least one of the first and second supports.

In one embodiment the mechanical linkage includes one or more gears and the drive member includes a gear wheel.

In one embodiment the measurement actuator system is at least one of coupled to and part of a pre-polarisation actuator system for rotating pre-polarisation magnets in a pre-polarisation array between the first and second positions to thereby control a pre-polarisation field.

In one embodiment the measurement actuator system is at least one of: pneumatically operated; hydraulically operated; manually operated; and, electrically operated using a motor.

In one embodiment the first and second supports include respective annular cylindrical support bodies having support body axes coincident with a field of view axis and wherein the measurement field direction is perpendicular to a pre-polarisation field direction and the field of view axis.

In one embodiment the measurement magnets are elongate bar magnets extending parallel to a field of view axis of the field of view and with poles orientated perpendicularly to the field of view axis.

In one embodiment the measurement magnets have at least one of: a cross-sectional area of at least one of: at least $0.5$ cm$^2$; at least $0.6$ cm$^2$; less than $1.0$ cm$^2$; between $0.5$ cm$^2$ and $1.0$ cm$^2$; between $0.6$ cm$^2$ and $0.9$ cm$^2$; approximately $0.72$ cm$^2$, a length of at least one of: at least 10 cm; at least 15 cm; less than 100 cm; less than 80 cm; and, between 15 cm and 70 cm; and, a remnant field strength of at least one of: at least $0.1$ T; at least $0.15$ T; and, less than $0.5$ T.

In one embodiment each measurement magnet array has at least one of: a plurality of magnets numbering at least one of: 12 magnets; 16 magnets; and, 24 magnets; and, a radius of at least one of: less than 10 cm; more than 7.5 cm; between 8 cm and 9 cm; and, at least 20 cm; less than 30 cm.

In one embodiment the measurement field has at least one of: a strength adjustable between 0 µT and 0.01 T; and, a field homogeneity of at least one of: greater than 200 ppm; and, greater than 230 ppm.

In one embodiment the field of view has a volume of at least one of: at least 50 cm$^3$; at least 75 cm$^3$; at least 100 cm$^3$; and at least 125 cm$^3$.

It will be appreciated that the broad forms of the invention and their respective features can be used in conjunction, interchangeably and/or independently, and reference to separate broad forms is not intended to be limiting.

BRIEF DESCRIPTION OF THE DRAWINGS

Various examples and embodiments of the present invention will now be described with reference to the accompanying drawings, in which:

FIG. 3A is a schematic diagram of an example of a sleeve for a pre-polarisation magnet;

FIG. 3B is a schematic diagram of an example of a piston in an extended position;

FIG. 3C is a schematic diagram of an example of a piston in a retracted position;

FIG. 10A is a graph showing a plot of an example of field homogeneity along an x-axis for a pre-polarisation array having twenty four pre-polarisation magnets;

FIG. 10B is a graph showing a plot of an example of field homogeneity along an x-axis for a pre-polarisation array having twenty four pre-polarisation magnets;

DETAILED DESCRIPTION OF THE PREFERRED EMBODIMENTS

Figure 1A:
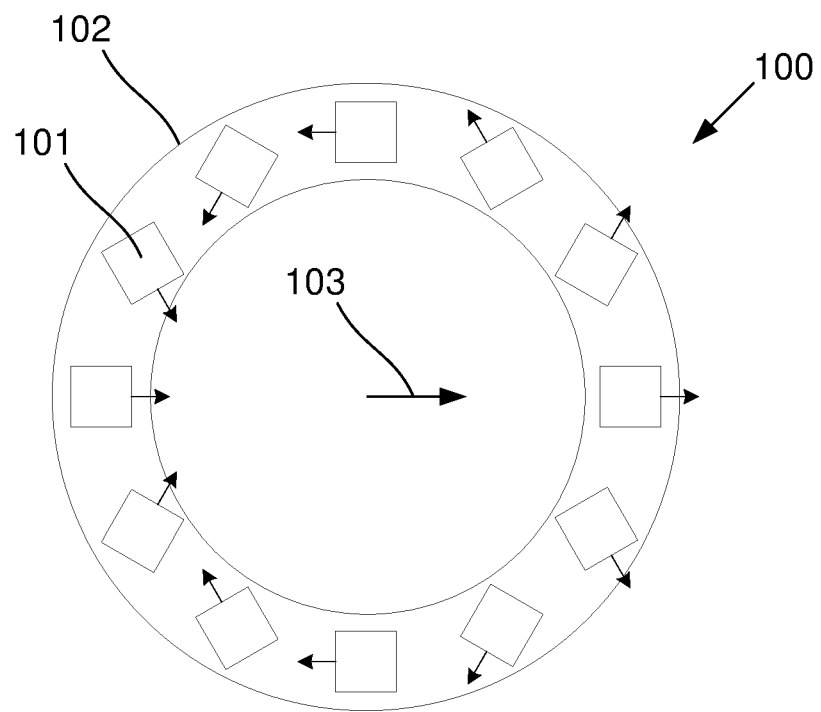
FIG. 1A is a schematic diagram of a cross-sectional view of an example of a pre-polarisation magnet array with pre-polarisation magnets in a first position.
Figure 1B:
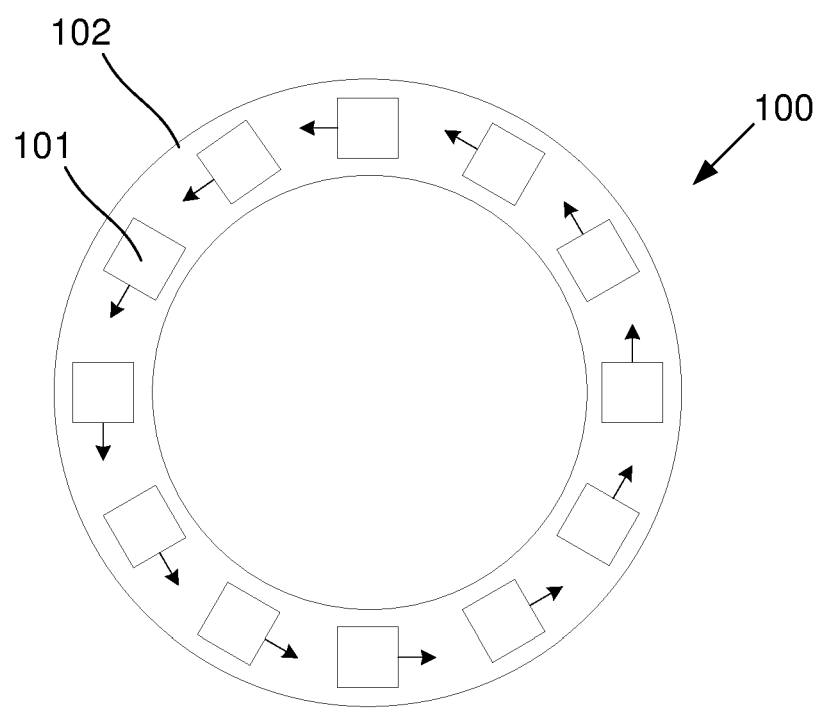
FIG. 1B is a schematic diagram of a cross-sectional view of an example of a pre-polarisation magnet array with pre-polarisation magnets in a second position.

An example of a pre-polarisation magnet arrangement for generating a pre-polarisation field for use in a low field magnetic resonance process will now be described with reference to FIGS. 1A and 1B.

In this example, the pre-polarisation magnet arrangement 100 includes a pre-polarisation field array including a plurality of permanent pre-polarisation magnets 101 mounted in a support 102 and provided in a circumferentially spaced arrangement surrounding a field of view. Some or all of the pre-polarisation magnets 101 are movable between respective first and second positions shown in FIGS. 1A and 1B respectively.

In the first position, the pre-polarisation magnets are configured as a cylindrical Halbach array to generate a pre-polarisation field in the field of view, orientated as shown by the arrow 103. In this regard, Halbach arrays are a versatile arrangement of permanent magnets that can be used to generate strong, highly homogeneous magnetic fields in a field of view (FOV), and which are therefore well suited for use as a pre-polarisation field.

In the second position the pre-polarisation magnets are configured to minimize the pre-polarisation field in the field of view, and a number of different configurations of second position can be used. In the example shown in FIG. 1B, the pre-polarisation magnets are arranged tangentially, with the poles of each pre-polarisation magnet being aligned with the circumference of the array. However, this is not essential, and alternatively other configurations, such as a reverse cylindrical Halbach array or radial arrangement could be used, and relative benefits will of these different configurations will be discussed in more detail below.

Examples of the fields produced by the Halbach array, a reverse cylindrical Halbach array, a tangential configuration and a radial configuration are shown in FIGS. 2A to 2D respectively, highlighting the strong homogeneous field for the first position and a significantly reduced field for the second position, making pre-polarisation of samples in an acquisition region feasible.

Accordingly the above described pre-polarisation magnet arrangement can be used to generate a pre-polarisation field for use in ultra-low field imaging processes. In particular, the arrangement allows a pre-polarisation field to be created with a sufficiently high homogeneity and strength to allow this to be suitable for low field imaging applications. Furthermore, the pre-polarisation field can be effectively "turned off", by simply altering the orientation of the pre-polarisation magnets, allowing this to be achieved using physical actuation, as will be described in more detail below. This in effect provides a dynamic switchable pre-polarisation field, which in turn makes it feasible to provide for ultra-low field pre-polarisation without requiring the use of electromagnets or resistive coils. This therefore significantly reduces the volume and energy requirements compared to traditional electromagnet or coil based systems, improving portability considerably.

In particular, permanent magnets do not require electric current flow to generate magnetic fields. Hence, sample heating due to energy dissipation in resistive material is avoided, cooling devices obviated and power consumption significantly reduced compared to resistive coil technology. Moreover, the conductivity of the material used in permanent magnets is much lower than materials like copper used in resistive coils. Hence, eddy current effects from rapid changes in magnetic field, which can lead to signal artefacts and noise, are reduced.

Accordingly, the use of the permanent magnet pre-polarisation array can be used to allow a lower power portable imaging system to be created, which avoids significant artefacts and noise associated with electromagnetic coils, allowing an accurate portable imaging apparatus to be created which is suitable for desktop imaging applications.

A number of further features will now be described.

Typically the pre-polarisation magnets are rotatably mounted to the support, allowing the pre-polarisation magnets to rotate about magnet axes parallel to an array axis, with the direction and magnitude of the rotation depending on the particular first and second positions of each pre-polarisation magnet. It will also be appreciated that this is not essential and any rotation or other movement could be used.

In one example, the pre-polarisation magnet arrangement includes a pre-polarisation actuator system for rotating the pre-polarisation magnets between the first and second positions to thereby control the pre-polarisation field. The nature of the actuator system will vary depending on the preferred implementation and a specific example will now be described with reference to FIGS. 3A to 3C and 4A and 4B.

In this example, each pre-polarisation magnet 301 is mounted in a housing 302, which is rotatably mounted to the support 401, for example using a suitable bearing or the like (not shown). The support 401 could be of any appropriate form, but in one example has a generally annular and cylindrical form extending in an axial direction, typically made from two annular end plates interconnected by suitable struts, and made of a non-magnetic and substantially rigid material, such as a plastic or the like. The housing 302 is used to provide a mounting that can contain the pre-polarisation magnet 301, allowing this to protect the pre-polarisation magnet from impact and optionally provide electrical isolation. In one example, the housing 302 is in the form of a nylon sleeve, although this is not essential and any suitable arrangement could be used. The housing 302 can also provide a mechanism to interface with the actuator, for example, using an arm 303 extending laterally from the sleeve.

Figure 4A:
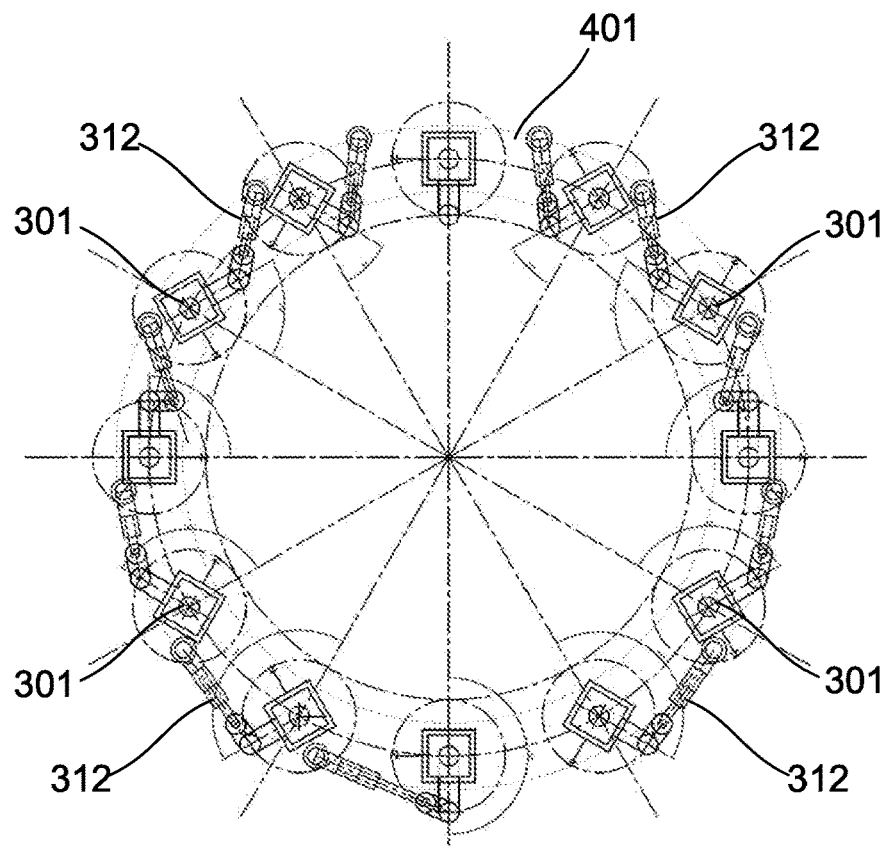
FIG. 4A is a schematic diagram of an example of a pre-polarisation array with actuators arranged so that the pre-polarisation magnets are in a first position.
Figure 4B:
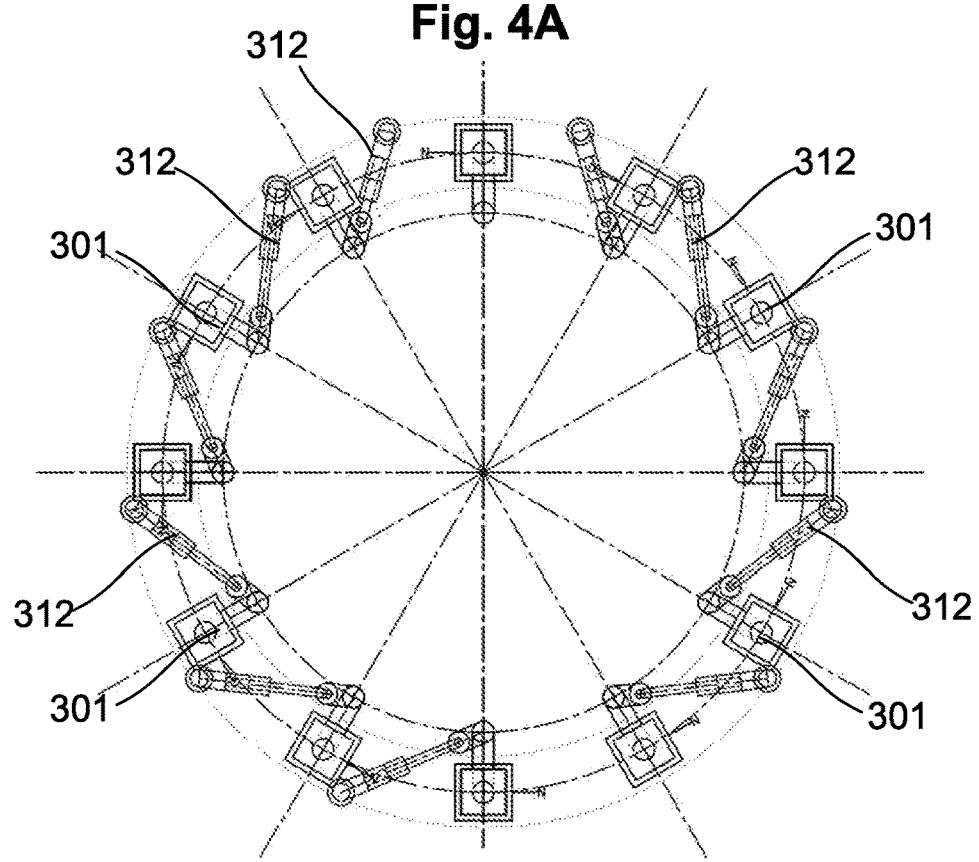
FIG. 4B is a schematic diagram of an example of a pre-polarisation array with actuators arranged so that the pre-polarisation magnets are in tangential second position.

In this example, the arm 303 can be coupled to a piston 311, via a connecting arm 312, as shown in FIGS. 3B and 3C. In this example, activation of the piston causes movement of the arm between extended and retracted positions shown in FIGS. 3B and 3C. By suitable positioning of the pistons around the circumference of the support, as shown in FIGS. 4A and 4B, this allows the pre-polarisation magnets to be rotated as required.

In such an arrangement, the pistons can be activated either pneumatically or hydraulically, avoiding the need for electrical systems, such as a motor, to be positioned near the imaging apparatus, which could in turn interfere with the magnetic fields generated by the system, including the pre-polarisation field, as well as measurement or spatial encoding fields.

To ensure accurate positioning of the pre-polarisation magnets, the actuator system typically has a tolerance of less than 40 arcsecond, and is configured to move each of the pre-polarisation magnets synchronously, by a required rotational amount, to thereby deactivate the field. In this regard, it is preferable to rotate the pre-polarisation magnets between the first and second positions so that the transition is performed synchronously, meaning that as different magnets rotate by different amounts, this may require different rotation speeds. It will be appreciated that in this instance, such movement can be coordinated by controlled delivery of fluid to the pistons.

However, it will be appreciated that alternative arrangements could be used. In one example, this could be achieved by providing a mechanical coupling between the pre-polarisation magnets so that the pre-polarisation magnets are moved in synchronization. The mechanical coupling could be used in conjunction with a separate actuator mechanism, such as the piston arrangement described above, or alternatively could be used to act as the actuator mechanism.

Such an arrangement could include a drive member and a mechanical linkage coupling each of the number of pre-polarisation magnets and the drive, so that each of the number of pre-polarisation magnets is rotated by a defined amount in a respective direction upon actuation of the drive. For example, the drive member could include a gear wheel, with the mechanical linkage including one or more gears, meaning that suitable selection of gearing could be used to ensure synchronous rotation of the magnets.

In this instance, movement of the pre-polarisation magnets could be effected using a rotary actuator, such as a motor, which could be a hydraulic motor, or an electric motor suitably shielded from the magnet arrangement. Alternatively, this could be performed manually.

Additionally, movement of the pre-polarisation magnets can be performed at least in part using magnetic forces between the pre-polarisation magnets. In this regard, the energy state of the pre-polarisation magnets when in the second position is generally lower than in the first position, meaning magnetic forces between the magnets can assist in rotating between the first and second positions. In this instance, the system might be primed by moving the magnets to the first position and then using a locking system to lock the pre-polarisation magnets in the first position. The locking system can be disengaged and the magnets moved to the second position once sufficient polarisation of the sample has occurred. This could be performed entirely based on the stored magnetic energy, or may be performed in conjunction with the action of an actuator, such as a piston or gear based system, and may use mechanical coupling to ensure synchronous rotation of the pre-polarisation magnets.

Whilst any configuration of permanent magnet can be used, the pre-polarisation magnets are typically elongate permanent cylindrical or rectangular bar magnets, with a remnant magnetisation orientated perpendicularly to the array axis. This enables the pre-polarisation magnets to generate a homogeneous field over a sufficiently deep acquisition region extending in the axial direction.

Whilst any suitable size of permanent magnet could be used, in one example, the pre-polarisation magnets typically have a cross-sectional area of at least one of, at least 5 cm$^2$, at least 6 cm$^2$, less than 10 cm$^2$, between 5 cm$^2$ and 10 cm$^2$, between 6 cm$^2$ and 9 cm$^2$, and more typically approximately 6.8 cm$^2$ to 8 cm$^2$. The magnets typically have a length of at least one of, at least 10 cm, at least 15 cm, less than 100 cm, less than 80 cm, and, more typically between 15 cm and 70 cm, and, a remnant field strength of at least one of, at least 0.5 T, at least 0.75 T, and, more typically at least 1 T. It will be appreciated however that other arrangements of magnets and field strengths are envisaged, depending for example on the availability of particular permanent magnet configurations, and the ability of these to accommodate associated mechanical stresses.

The pre-polarisation magnet array can have any number of permanent magnets suitable for providing a cylindrical Halbach array and examples include, but are not limited to 12, 16, or 24 magnets. The magnets are typically provided circumferentially spaced on a radius of at least 10 cm, at least 12 cm, less than 20 cm, less than 18 cm; and more typically approximately 15 cm.

As previously mentioned, the support is typically an annular cylindrical support body having a support body axis coincident with the array axis, with the pre-polarisation field extending in a pre-polarisation field direction perpendicular to the array axis.

With the pre-polarisation magnets in the first position the pre-polarisation field typically has a strength in the field of view of at least one of, at least 10 mT, at least 50 mT and more typically at least one of, at least 100 mT and a field inhomogeneity of less than 230 ppm and more typically less than 200 ppm.

In contrast, with the pre-polarisation magnets in the second position the pre-polarisation field has a strength in the field of view of at least one of, less than 1 nT, less than 0.1 nT and more typically less than 0.01 nT.

Whilst the field of view could be of any size, depending on the configuration of the pre-polarisation array, in one example, the field of view has a volume of at least one of, at least 50 cm$^3$, at least 75 cm$^3$, at least 100 cm$^3$, and more typically at least 125 cm$^3$. It will be appreciated that the field of view could be of any suitable shape, such as cylindrical, spherical or the like, depending on the preferred implementation.

The pre-polarisation array can also be used in conjunction with a measurement magnet arrangement for generating a measurement field in the field of view to thereby provide a complete pre-polarisation and measurement field system. It will be appreciated if further integrated with an arrangement for providing encoding, such as a linear gradient field or non-linear encoding field, and a suitable sensing arrangement, such as a suitable magnetometer, this can be used to provide a complete imaging system. As the measurement field is generally of a significantly lower magnitude than the pre-polarisation field, in one example, the measurement field can be generated by a configuration of magnets that generate a permanent static measurement field. However, this is not essential and alternatively example arrangements could be provided for generating a controllable field, and in particular a field whose magnitude and directionality can be controlled.

Typically the pre-polarisation magnet arrangement generates a pre-polarisation field having a pre-polarisation field direction perpendicular to an axis of the pre-polarisation array, whilst the measurement magnet arrangement generates a measurement field having a measurement field direction that is also perpendicular to the array axis, as well as being perpendicular to the pre-polarisation field direction.

The measurement magnet arrangement typically includes at least one measurement field array mounted radially outwardly of the support or radially inwardly of the support, although this is not essential, and alternatively a common support could be used for both the pre-polarisation and measurement field arrays.

Whilst the measurement magnet system could be adapted to generate a measurement field having a fixed field strength, this is not essential, and alternatively, the measurement magnet arrangement could be adapted to generate a controllable strength measurement field.

An example of this will now be described with respect to FIGS. 5A to 5D.

Figure 5A:
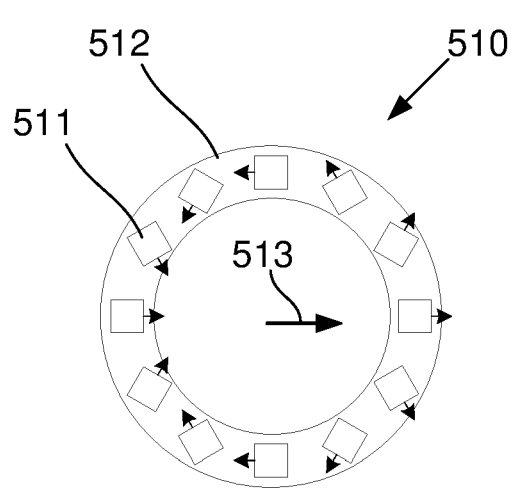
FIG. 5A is a schematic diagram of a cross-sectional view of an example of a first measurement array.
Figure 5B:
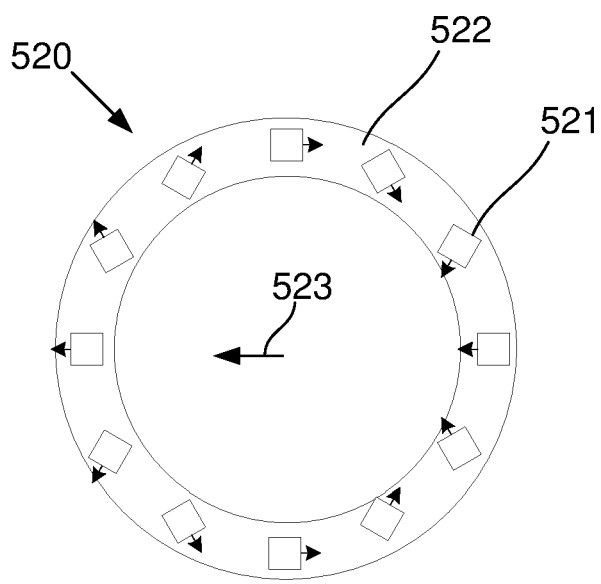
FIG. 5B is a schematic diagram of a cross-sectional view of an example of a second measurement array.

In this example, the measurement magnet system includes a first measurement array 510, shown in FIG. 5A, which includes a plurality of permanent first measurement magnets 511 mounted in a first support 512 in a circumferentially spaced arrangement and configured to generate a first field in the field of view, the first field being orientated in a first direction relative to the first support, as shown by the arrow 513. The magnet system further includes a second measurement array 520 including a plurality of permanent second measurement magnets 521 mounted in a second support 522 in a circumferentially spaced arrangement and configured to generate a second field in the field of view, the second field being orientated in a second direction, shown by arrow 523, relative to the second support.

Figure 5C:
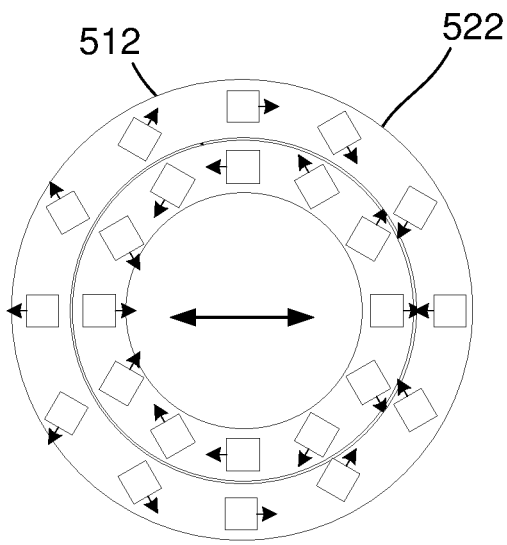
FIG. 5C is a schematic diagram of a cross-sectional view of an example of a measurement magnet system with first and second measurement arrays in a first relative orientation.
Figure 5D:
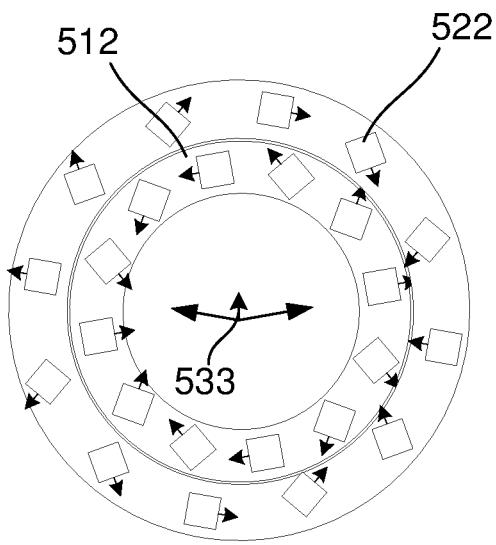
FIG. 5D is a schematic diagram of a cross-sectional view of the measurement magnet system of FIG. 5C with the first and second measurement arrays in a second relative orientation.

In use, the first and second supports are concentrically arranged about a field of view, as shown in FIGS. 5C and 5D, so that first and second measurement arrays can be relatively rotated allowing a strength of a measurement field in the field of view to be controlled. Specifically, in the example of FIG. 5C, the first and second measurement arrays generate fields of equal strength. With these positioned in opposition, the fields cancel within the field of view or field of view, and the net measurement field has a zero field strength. In contrast to this, in the example of FIG. 5D, the first and second measurement arrays are rotated, with the second measurement array being rotated in a clockwise direction and the first measurement array being rotated in an anticlockwise direction, so that the first and second fields generate fields having a component extending in the direction of arrow 533, thereby generating a net measurement field extending parallel to the arrow 533.

A number of further features of the measurement magnet arrangement will now be described.

As mentioned above, when the first and second directions are in opposition a measurement field in the field of view is minimized, whereas when the first and second directions are at least partially aligned with a measurement field direction, a net measurement field is generated extending in the measurement field direction, with the strength of the measurement field being controlled by a degree of alignment of the first and second directions. In order to generate a null field when the fields are in opposition, it will be appreciated that the first and second fields need to have equal field strengths. However, this is not essential and alternatively non-zero minimum fields can result.

In one example, the first and second measurement arrays are configured as respective cylindrical Halbach arrays, which helps ensure the generation of homogeneous fields over the field of view.

In one example, the measurement magnet arrangement includes mechanical coupling between the first and second measurement arrays so that the first and second measurement arrays are rotated synchronously in opposing directions. This can be used to ensure consistency of the direction of the measurement field, whilst allowing the magnitude of the measurement field to be easily adjusted. The mechanical coupling can be of any appropriate form and could include a mechanical linkage, such as a gearing arrangement, to ensure synchronous rotation of the first and second measurement arrays.

Additionally and/or alternatively, the measurement arrangement could include a measurement actuator system for actively relatively rotating the first and second permanent magnet arrays. This could include pistons coupled to the first and second supports, or could include a drive member and a mechanical linkage coupling, such as a gearing arrangement, that rotates at least one of the first and second supports. This can assist in providing electronic control of the measurement field, allowing this to be more easily controlled, although this is not essential and it will be appreciated that manual control of the measurement field could be used.

In one example, the measurement actuator system is at least one of coupled to and part of a pre-polarisation actuator system for rotating pre-polarisation magnets in a pre-polarisation array between the first and second positions to thereby control a pre-polarisation field. In this instance, control of the measurement field could be performed in conjunction with control of the pre-polarisation field, for example to increase the measurement field to a desired strength as the pre-polarisation field is deactivated. However, given that the measurement field may remain constant during pre-polarisation and measurement, due to its significantly smaller magnitude than the pre-polarisation field, this is not essential.

In one example, the first and second supports include respective annular cylindrical support bodies having support body axes coincident with a field of view axis. The first and second supports could be of any appropriate form, but typically include two annular end plates interconnected by suitable struts, and made of a non-magnetic and substantially rigid material, such as a plastic or the like.

The measurement arrays are typically configured to generate a measurement field in a direction that is perpendicular to a pre-polarisation field direction and the field of view axis.

The measurement magnets are typically elongate bar magnets extending parallel to a field of view axis of the field of view and with a poles orientated perpendicularly to the field of view axis. The measurement magnets typically have a cross-sectional area of at least one of: at least $0.5$ cm$^2$, at least $0.6$ cm$^2$, less than $1.0$ cm$^2$, between $0.5$ cm$^2$ and $1.0$ cm$^2$, between $0.6$ cm$^2$ and $0.9$ cm$^2$, and more typically approximately $0.72$ cm$^2$. The magnets typically have a length of at least one of: at least 10 cm, at least 15 cm, less than 100 cm, less than 80 cm and more typically between 15 cm and 70 cm. The measurement magnets typically have a remnant field strength of at least one of: at least 0.1 T, at least 0.15 T and less than 0.5 T. Each measurement magnet array typically has at least one of 12 magnets, 16 magnets and 24 magnets, and a radius of at least one of less than 10 cm, more than 7.5 cm, between 8 cm and 9 cm, or at least 20 cm and less than 30 cm.

In order to for the first and second measurement arrays to generate fields having a similar magnetic field strength, despite being arranged concentrically, it will be appreciated that the first and second measurement arrays can have different magnet configurations. For example, the first and second measurement arrays can having different numbers of magnets, magnets with different field strengths, or the like.

Typically, the resulting measurement field has at least one of: a strength adjustable between 0 μT and 0.01 T, a field homogeneity of at least one of: less than 230 ppm and more typically less than 200 ppm.

In one example, the field of view has a volume of at least one of, at least 50 cm$^3$, at least 75 cm$^3$, at least 100 cm$^3$, and more typically at least 125 cm$^3$. It will be appreciated that the field of view could be of any suitable shape, such as cylindrical, spherical or the like, depending on the preferred implementation.

The measurement magnet arrangement can also be used in conjunction with a pre-polarisation magnet arrangement for generating a pre-polarisation field in the field of view to thereby provide a complete pre-polarisation and measurement field system. It will be appreciated if further integrated with an arrangement for providing encoding, such as a linear gradient field or non-linear encoding field, and a suitable sensing arrangement, such as a suitable magnetometer, this can be used to provide a complete imaging system.

Figure 6:
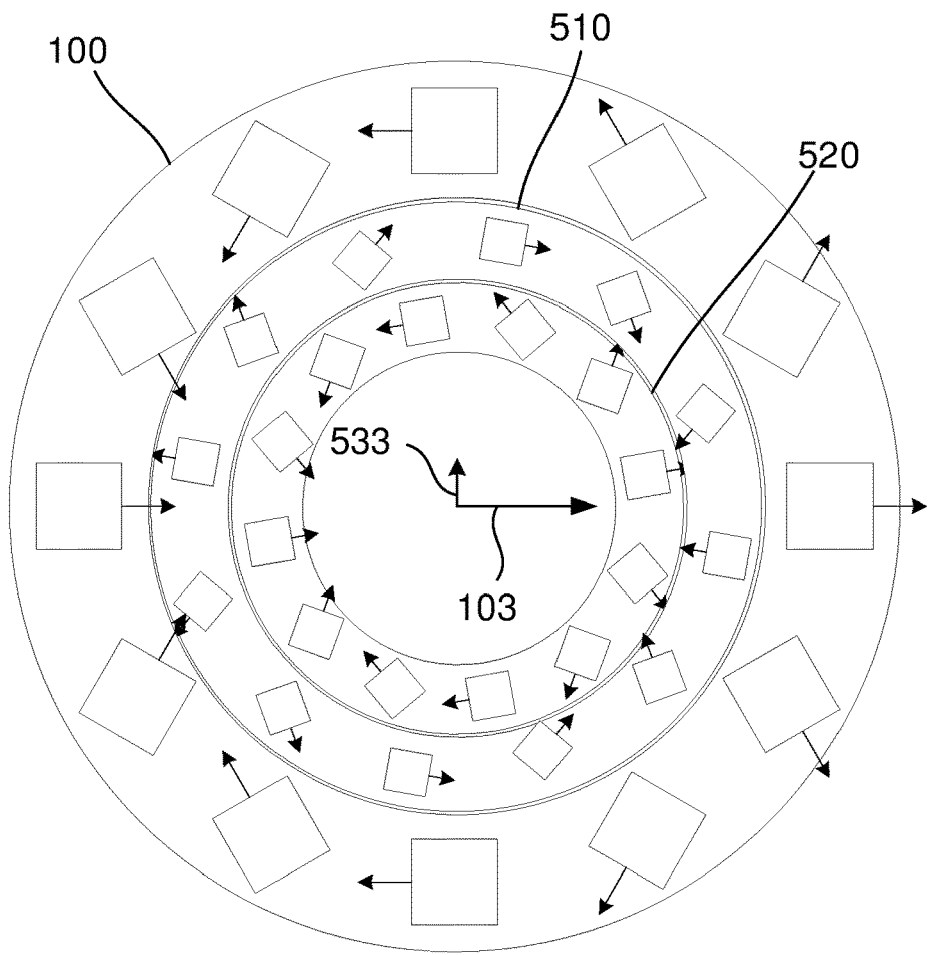
FIG. 6 is a schematic diagram showing an example of a magnet arrangement for generating pre-polarisation and measurement fields.

An example of a combined pre-polarisation and measurement field generating apparatus is shown in FIG. 6.

In this example, the measurement field arrays 510, 520 are positioned inwardly of the pre-polarisation field array 100, but this is for the purpose of illustration only and in practice the pre-polarisation field array 100 will typically be positioned inwardly of the measurement field arrays 510, 520, given that the pre-polarisation field requires a higher strength in the field of view. Additionally, as the measurement field has a reduced strength, the measurement magnets can be significantly smaller than the pre-polarisation magnets, it will be understood that FIG. 6 is not drawn to scale.

Specific example arrangements will now be described in more detail.

In this example, a finite element method (FEM) is used to determine the magnetic fields generated by the above described small permanent magnet arrays (SPMA) to determine achievable field strengths and field homogeneity. In addition, a manually operated SPMA was built to demonstrate the ability to generate the magnetic fields required for ULF relaxometry.

For the purpose of this example, the dynamic SPMA for ULF relaxometry is similar to that shown in FIG. 6, and includes cylindrical permanent magnets of finite length, transversely magnetised (i.e. in an x-y plane) arranged in three concentric cylindrical arrays. Each pre-polarisation magnet of the pre-polarisation array was pivotally-mounted about its own axis in the z-coordinate direction to allow the generation of different magnetic field configurations by prescribed rotations of each pre-polarisation magnet. In contrast, the orientation of each measurement magnet within the measurement arrays 510, 520 was fixed, but the two measurement arrays were able to rotate about the z-axis, as previously described.

In one example, the pre-polarisation array 100 includes 24 magnets, whilst measurement arrays 510, 520 include 12 magnets each. The origin of the coordinate system was positioned at the centre of the arrays and the axes of the arrays were aligned along the z-axis, with the pre-polarisation field $B_p$ being orientated along the x-axis and the measurement field $B_m$ orientated along the y-axis. In the Halbach configuration used in the pre-polarisation and measurement arrays, each magnet has a specific orientation different to the neighbouring magnets.

Figure 7:
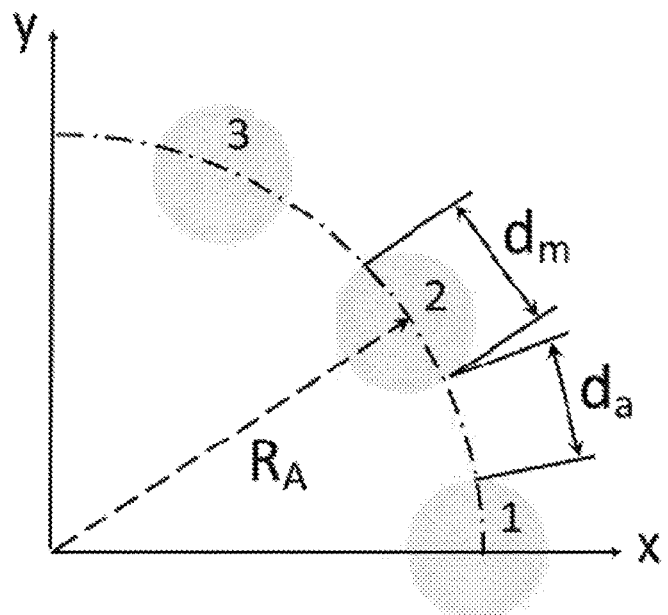
FIG. 7 is a schematic diagram showing an example of pre-polarisation magnet array spacing.

To study the magnetic forces, the magnets of pre-polarisation array 100 were numbered counter-clockwise starting at the right-hand-side, as shown in FIG. 7. The following parameters were used when designing the array:
  field of view within the centre of the SPMA 5×5×5 cm$^3$;
  $B_p$ magnitude>100 mT;
  $B_m$ magnitude 20-50 µT (852-2130 Hz).

The FOV was chosen to be sufficient for both ULF-NMR measurements and for a small ULF imaging device. $B_m$ is selected to correspond to the proton ($^1$H) Larmor frequency $\omega_L$ as determined by the Larmor equation:

$$\omega_L = 2\pi f_L = \gamma B_m \quad (1)$$

where: γ is the gyromagnetic ratio, which is 267.5×106 rad/sec/T for protons.

Four different magnetisation patterns were considered in this study. They were created by prescribed rotations of each cylindrical magnet in the pre-polarisation array, as shown in FIGS. 2A to 2D, namely, Halbach, reverse Halbach, tangential and radial configurations respectively. The Halbach pattern is known to achieve a strong homogeneous magnetic field in the centre of the pre-polarisation array, while the lowest field strength or field cancellation (indicated by irregular field distribution in the centre) is achieved with the reverse Halbach, tangential or radial magnetisation patterns. Different magnetisation patterns and numbers of permanent magnets in the array lead to different magnetic field distributions, field strength and homogeneity in the centre of the array as will now be described.

The complexity of the fields associated with different conformations of the SPMA precluded an analytical approach. Hence a rigorous numerical analysis was performed using COMSOL (version 4.3b, AC/DC module, Magnetostatic), a commercial finite element method (FEM) simulation environment with a computer-aided design interface for 3D model design. Simulations were carried out using an x64-based 16 core PC (Dell Precision T7600) with 128 GB of RAM. In the FEM simulation, the SPMA model was discretised in 3D-tetrahedral meshes using a predetermined mesh distribution and density that had been optimised using COMSOL. Mesh density was manually increased to achieve sub-millimetre spatial resolution in the centre of the array. The number of mesh points generally ranged between 40-50 million which ensured convergent and accurate results within reasonable time frames. The size of the cylindrically shaped computational window (diameter 1.2 m, length 2.1 m) was set to be sufficiently large to be able to model the SPMA (diameter 0.4 m, length 0.7 m) and to minimise numerical errors due to discontinuities. The standard COMSOL Neumann boundary condition was used to represent magnetic shielding implemented in a previously described ULF instrument developed at the Centre for Advanced Imaging, with thickness d=12 cm and permeability µr=5500. The relative permeability of the material in the magnets was set to 1.05 and for the surrounding environment (air) it was 1.

The pre-polarisation array which generates the pre-polarisation field $B_p$, had an assumed fixed radius R=11 cm and array length L=70 cm. It consisted of n identical cylindrical magnets each with a remanent magnetic field strength ($B_r$) of 1 Tesla (T). Notably, other commercially available magnet cross-sections lead to equivalent qualitative results provided that magnet size is small compared to the distance to the centre of the array. An ideal Halbach array is characterized by a continuous change in the azimuthal direction of the magnetisation vector, which at present cannot be achieved. Hence, cylindrical Halbach arrays are discretised by identical magnets with constant $B_r$ and the approximation improved by progressively increasing the number of magnets along the circumference. In this study n=12, 16 and 24 magnets were considered.

The array radius R was fixed to ensure that the SPMA fits within the magnetic shielding device. To allow the performance of SPMAs with different numbers of magnets to be compared while keeping the overall size constant, a fill factor was introduced. This factor quantifies the ratio of magnetic material to air gap (dm to da) along the circumference, as shown in FIG. 7. A fill factor of 0.75, for instance, corresponds to 75% occupancy by magnets (dm) and 25% by air (da) along the circumference. Magnet diameter dm is thus dependent on the total number of magnets n and is approximately:

$$d_m = 2\pi \frac{Fillfactor \cdot R}{n} \quad (2)$$

For the measurement array, the measurement field $B_m$ was generated by superimposing two magnetic fields generated by first and second measurement arrays ($B_{m1}$), ($B_{m2}$) with radii $R_1$=8 cm and $R_2$=9 cm, respectively, each with the fixed Halbach pattern. As with the pre-polarisation array, this arrangement ensured a highly directional and homogeneous magnetic field along the y-axis. Magnetic fields from the two arrays cancel within the FOV when the magnetic field magnitudes $B_{m1}$ and $B_{m2}$ are matched and their directions are opposite, as shown in FIG. 5C. By rotating the first and second measurement arrays by the same angle but in opposite directions about the z-axis, the total magnetic field remains parallel to the y-axis and comprises the measurement field $B_m$ as shown by arrow 533 in FIG. 5D.

The most desired field properties for NMR experiments are field strength, directionality and homogeneity. In the case of the ULF relaxometer proposed here the qualitative targets to optimize the SNR were:

uniform field direction and maximum magnitude of $B_p$ during sample pre-polarisation (switched on).

minimum magnitude for the pre-polarisation field $B_p$ during the measurement period.

uniform field direction and homogeneous variable measurement field $B_m$.

Figure 8A:
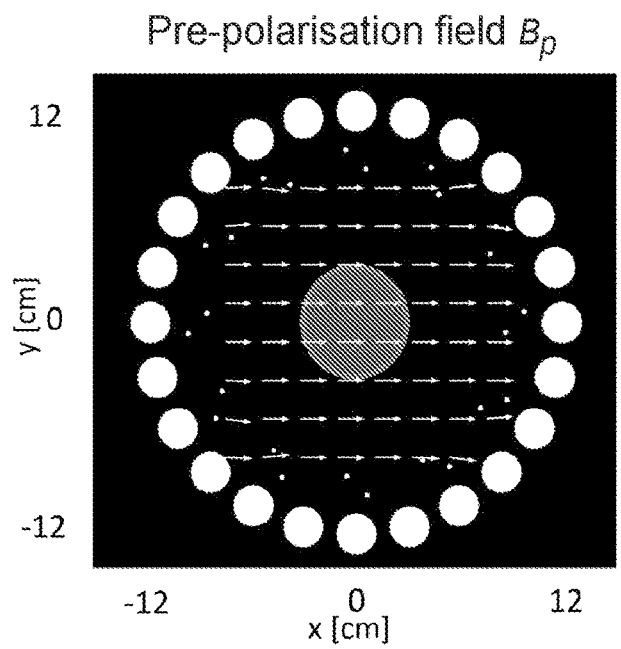
FIG. 8A is a schematic diagram of an example of the magnetic flux of the pre-polarisation field during pre-polarisation.

A numerical simulation was performed for the pre-polarisation array during pre-polarisation ('switched on'). The magnetic flux density distribution of pre-polarisation field $B_p$ generated with the Halbach pattern of FIG. 2A, with magnet properties L=70 cm, dm=2.16 cm, $B_r$=1 T, is presented as x-y cross section plot at the centre of the array (z=0) in FIG. 8A. In the same figure, an arrow plot shows the local field direction of the pre-polarisation field $B_p$ parallel to the x-axis, and the FOV is visualised by light grey disks. In this simulation, measurement arrays are not included since the pre-polarisation field $B_p$ produced by pre-polarisation array is more than 1000 times larger than the measurement field $B_m$. The magnetic field distortion due to differences in electric permeability can be ignored because the relative permeability of the permanent magnets is very similar to that of the air (1.05 versus 1.00).

Figure 8B:
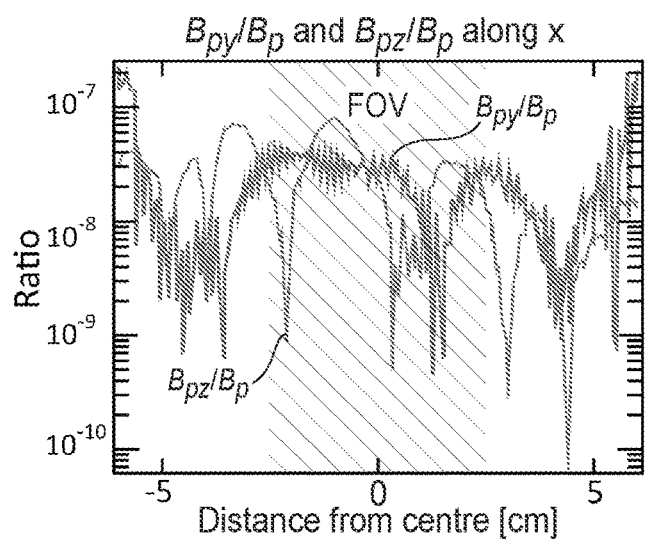
FIG. 8B is a graph showing a plot of an example of relative strengths of y and z components of the pre-polarisation field along the x-axis.
Figure 8C:
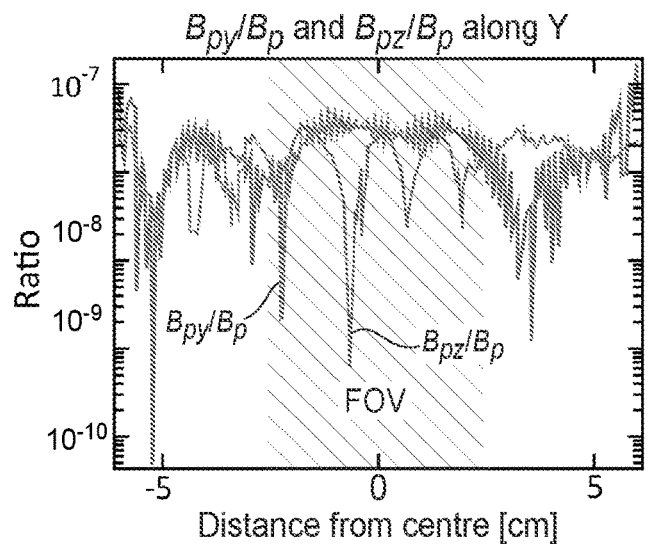
FIG. 8C is a graph showing a plot of an example of relative strengths of y and z components of the pre-polarisation field along the y-axis.

The directionality and homogeneity of the pre-polarisation field $B_p$ was assessed by the ratio of the minor field component ($B_{py}$, $B_{pz}$, as the y and z components of the pre-polarisation field $B_p$ field, respectively) to the main component of pre-polarisation field $B_p$ (along the x-axis). FIGS. 8B and 8C show cross-sectional plots of the magnetic flux density ratios $B_{py}/B_p$ and $B_{pz}/B_p$ along x and y axes demonstrating that $B_{py}$ and $B_{pz}$ are at least six orders of magnitude smaller than the pre-polarisation field $B_p$ in all directions within the FOV. Plots along the z-axis were omitted since all ratios are well below $1 \times 10^{-9}$.

12, 16 and 24 magnet configurations were analysed with fill factors of 0.75, 12 magnets with a fill factor of 0.375 and 16 magnets with a fill factor of 0.5 were analysed to study the effect of these parameters on the pre-polarisation field. The main results are summarized in Table 1 and the field magnitude along the x-axis is shown in FIGS. 9A to 9D.

TABLE 1

| Number of magnets | Fill factor | Centre Field strength [mT] | Field inhomogeneity within the FOV [%] |
|---|---|---|---|
| 12 | 0.75 | 214.58 | 0.023 |
| 16 | 0.75 | 162.56 | 0.0175 |
| 24 | 0.75 | 109.15 | 0.011 |
| 16 | 0.5 | 76.29 | 0.008 |
| 12 | 0.375 | 54.51 | 0.006 |

Figure 9C:
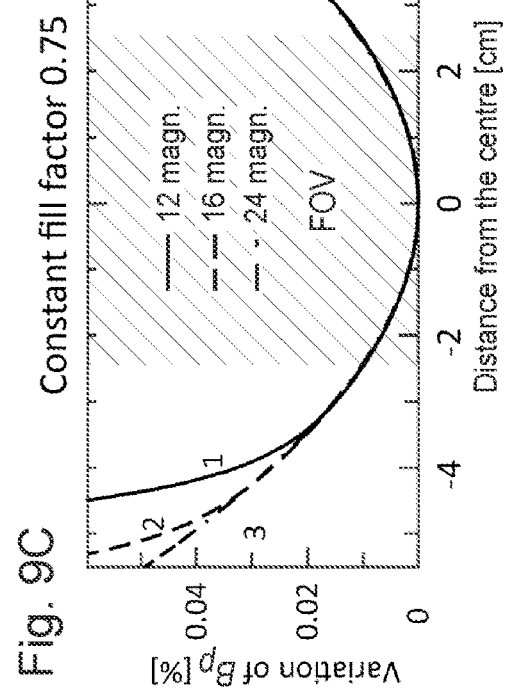
FIG. 9C is a graph showing a plot of an example of field homogeneity along an x-axis for different numbers of pre-polarisation magnets with a constant fill factor.
Figure 9D:
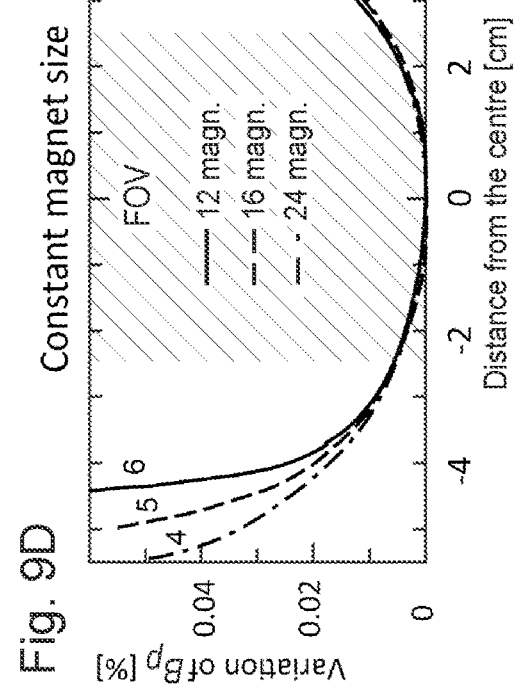
FIG. 9D is a graph showing a plot of an example of field homogeneity along an x-axis for different numbers of pre-polarisation magnets with a constant magnet size.
Figure 9A:
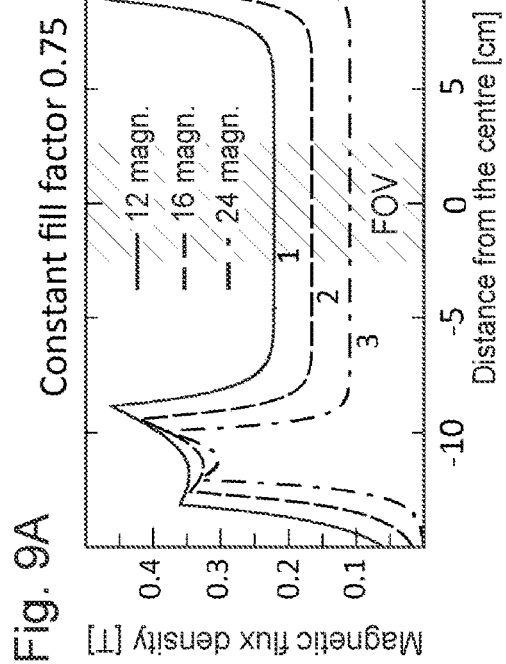
FIG. 9A is a graph showing a plot of an example of magnetic flux density along an x-axis for different numbers of pre-polarisation magnets with a constant fill factor.
Figure 9B:
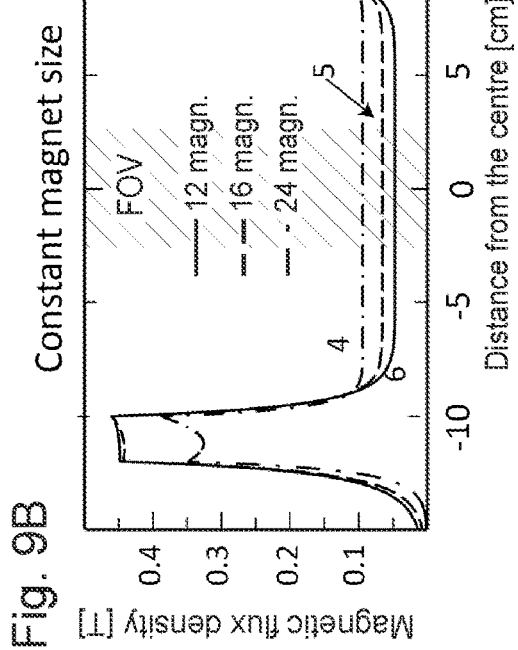
FIG. 9B is a graph showing a plot of an example of magnetic flux density along an x-axis for different numbers of pre-polarisation magnets with a constant magnet size.

The solid line plots correspond to 12 magnets, dashed line plots to 16 magnets and dash-dotted plots to 24 magnets. For a constant fill factor of 0.75, the achievable field strength increases with decreasing magnet number, as illustrated in FIG. 9A, because of the greater magnet surface and volume, according to equation 2. In contrast, by reducing the fill factor or the number of magnets, the pre-polarisation field strength decreased if magnet size was kept constant, as shown in FIG. 9B. However, in all cases the magnetic field variation of the pre-polarisation field $B_p$ remained below 0.023% (230 ppm), as demonstrated in FIGS. 9C and 9D. The high field homogeneity is due to the combination of a small FOV compared to the large volume of the SPMA.

FIGS. 10A and 10B illustrates the relative variation in magnitude of the pre-polarisation field $B_p$ in three dimensions for n=24 magnets (fill factor 0.75) with respect to the magnitude at the centre plotted along the z-axis in 2 cm steps on the x-z and y-z planes, in FIGS. 10A and 10B, respectively, thereby demonstrating high field homogeneity within the whole volume of the FOV.

During the measurement period, the magnetic field within the centre of the SPMA produced by pre-polarisation array must be minimised to enable precession and relaxation of the magnetisation vector of the sample. This is achieved by rotating each magnet of pre-polarisation array from the Halbach pattern of FIG. 2A to one of the three possible magnetisation patterns considered in this study, namely the reverse Halbach arrangement of FIG. 2B, the tangential arrangement of FIG. 2C, or radial arrangement of FIG. 2D.

Figure 11A:
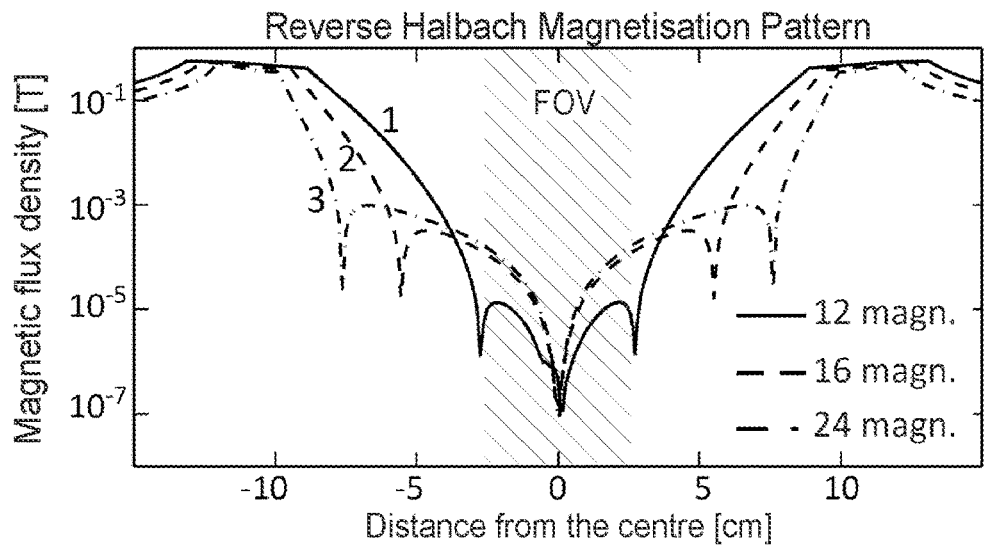
FIG. 11A is a graph showing a plot of an example of magnetic flux density along an x-axis for a pre-polarisation magnet array with pre-polarisation magnets in a second position defining a reverse cylindrical Halbach array.
Figure 11B:
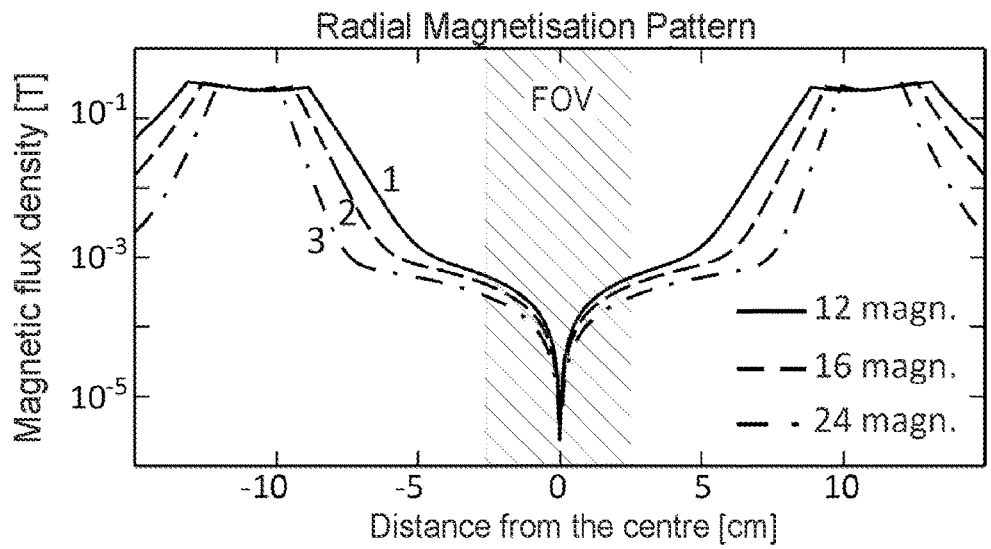
FIG. 11B is a graph showing a plot of an example of magnetic flux density along an x-axis for a pre-polarisation magnet array with pre-polarisation magnets in a radial second position.
Figure 11C:
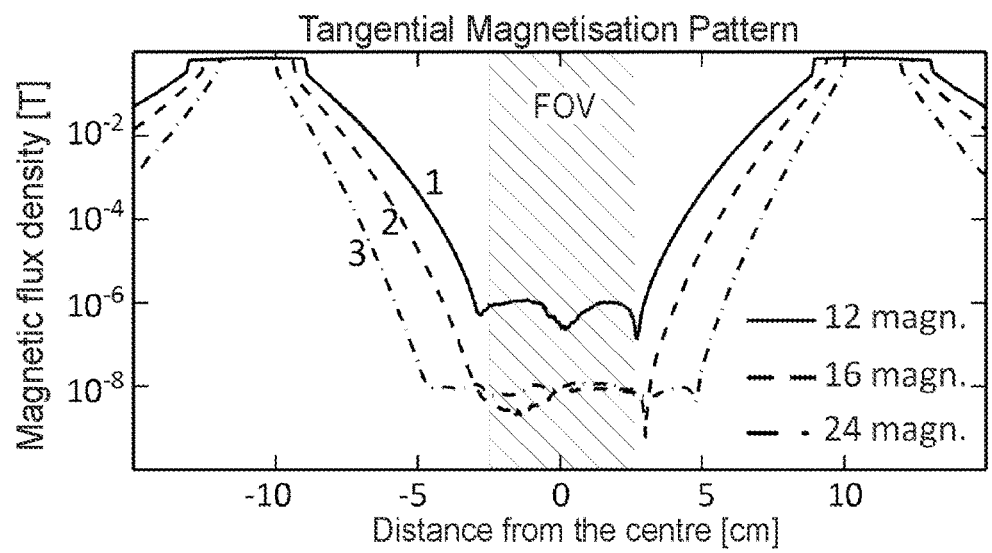
FIG. 11C is a graph showing a plot of an example of magnetic flux density along an x-axis for a pre-polarisation magnet array with pre-polarisation magnets in a tangential second position.

FIGS. 11A to 11C illustrates cross-sectional plots of the magnetic flux density generated by each pattern with the FOV indicated by the grey shaded area. Only the tangential pattern enabled field cancellation to magnitudes below 1 µT (fill factor=0.75) within the FOV, as shown in FIG. 11C. The residual magnetic field magnitude generated by the pre-polarisation array is low enough, less than $10^{-8}$ T for 16 or 24 magnets, as shown in FIG. 11C, so as not to interfere with the measurement field $B_m$ (20-50 µT). The measurement arrays were excluded from the simulations in this section. The magnitude of the magnetic flux density generated by pre-polarisation array was below 1 µT in a larger area with a larger number of magnets, as shown in FIG. 11C, which is expected since the SPMA conforms better to an ideal Halbach pre-polarisation arrays as the number of magnets increases. Nevertheless, it will be appreciated that the reverse Halbach and radial configuration could also be used for field cancellation, depending on the application, and the magnitude of the measurement field. For example, if the measurement field has a field strength of $B_m$=500 µT then the threshold could be increased, allowing the reverse Halbach and radial configurations to be used.

A similar effect was also observed during pre-polarisation with the Halbach pattern in FIG. 9A. From FIG. 11C, it can be concluded that 16 (curve 2) or 24 cylindrical magnets (curve 3) are suitable to ensure minimum interference from pre-polarisation array during the measurement period.

The inaccuracy in the angular position of the permanent magnets of pre-polarisation array in the tangential configuration induces a field inhomogeneity of about 90 µT/degree. This indicates that high precision actuators of less than 40 arcsecond tolerance would be desired to assist in keeping the pre-polarisation field $B_p$ below 2 µT.

Within the array, strong permanent magnets may generate considerable repulsive and attractive forces. Accordingly, the total magnetic energy within the pre-polarisation array was also examined to provide an index of how much energy was needed to change each permanent magnet in pre-polarisation array from pre-polarisation ('switched on') to measurement ('switched off') configurations. This parameter also relates to the mechanical stability of the pre-polarisation array and may influence switching time. Since measurement arrays were of much lower volume and remnant magnetisation of the component magnets was much lower, their contribution was not considered.

Table 2 lists the total magnetic energy contained in pre-polarisation array for different magnetisation patterns and numbers of magnets.

TABLE 2

| Number of magnets n | Halbach | Reverse Halbach | Tangential | Radial |
|---|---|---|---|---|
| 12 | 2216 (J) | 2220 (J) | 1270 (J) | 3104 (J) |
| 16 | 1683 (J) | 1689 (J) | 955 (J) | 2377 (J) |
| 24 | 1134 (J) | 1139 (J) | 638 (J) | 1614 (J) |

The total magnetic energy increased as the number of magnets decreased due to the higher magnet volume and surface area. The highest total magnetic energy for a given number of magnets was achieved with the radial pattern and the lowest with the tangential pattern. With the radial pattern, each magnet experienced repelling forces only (magnetisation vector parallel) whereas only attracting forces were present with the tangential pattern (magnetisation vector anti-parallel). The latter is similar to two adjacent bar magnets which are allowed to rotate freely. Their opposite poles will attract each other (magnetisation vector anti-parallel) and form a stable configuration in the lowest total energy state.

Figure 12A:
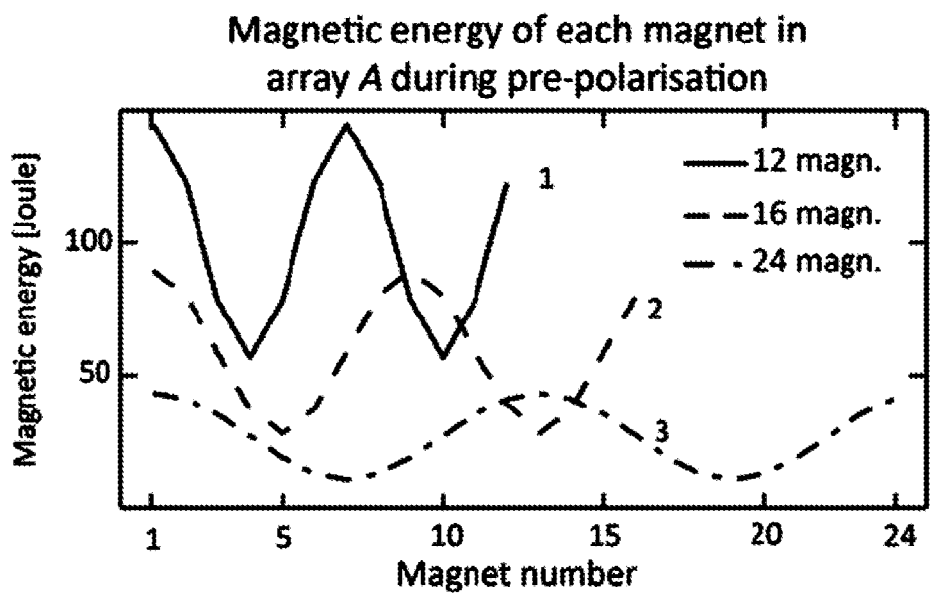
FIG. 12A is a graph showing a plot of an example of magnet energy for pre-polarisation magnets in a first position for different numbers of pre-polarisation magnets.

Due to the complex arrangement of magnetisation vectors in the Halbach pattern, each magnet has different stored total magnetic energy, as highlighted in FIG. 12A for 12, 16 and 24 magnets. Consequently, the energy required to rotate each magnet varies when pre-polarisation array switches from the Halbach pattern (pre-polarisation field) to the tangential pattern (measurement state), which is illustrated in FIG. 12B.

Figure 12B:
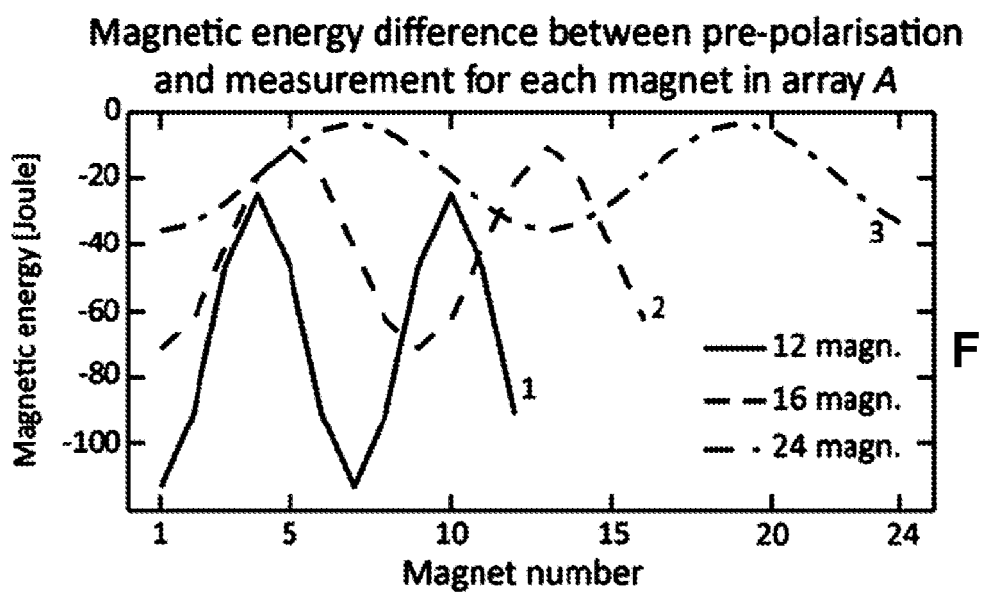
FIG. 12B is a graph showing a plot of an example of a difference in magnet energy between first and second positions of pre-polarisation magnets for different numbers of pre-polarisation magnets.

As an example, the total magnetic energy difference for magnet number 7 of a pre-polarisation array with 12 magnets was −117 Joules (J) see FIG. 12B, curve 1. The negative sign indicates energy release when magnet number 7 rotates from pre-polarisation to measurement states and +117 J is required to rotate it from the measurement to the pre-polarisation state. The findings favour rapid switching from the pre-polarisation to the measurement state because the magnets of pre-polarisation array tend naturally towards the tangential magnetisation pattern due to its lower total magnetic energy. Moreover, since the transition time from measurement to pre-polarisation is not a critical factor, it can be chosen to minimise mechanical vibrations, a potential source of measurement error.

The switching time from the pre-polarisation to the measurement state was estimated by assuming that the difference in magnetic energy is predominantly released as rotational energy. The rotational energy as a function of angular velocity (ω) is given by:

$$E_{rot} = 1/2 \omega^2 I \quad (3)$$

where: $I = \frac{1}{2} m_{mag} r_m^2$ is the moment of inertia of the cylindrical magnet about the axis of rotation, and $m_{mag}$ and $r_m$ denote the mass and radius of the magnet, respectively.

The pre-polarisation field strength generated by pre-polarisation array with 24 magnets exceeded 100 mT, set as a target for the study. Hence, the study of magnetic forces in pre-polarisation array was performed for this configuration. The average total magnetic energy for pre-polarisation array was approximately +/− 20 J (curve 3, FIG. 12B). With a magnet diameter $r_m = 1.08$ cm and fill factor of 0.75, and using the average density of rare-earth magnets (7400 Kg/m3), the angular speed was estimated to be around 600 rad/sec i.e. 10 ms for one revolution (100 Hz). Therefore, in principle, rapid switching of the pre-polarisation field can be achieved using SPMAs.

The mechanical force required to rotate each magnet from the measurement state to the pre-polarisation state was calculated by relating torque (τ) to magnetic energy (E):

$$E = \tau \Theta \quad (4)$$

where: $\Theta$ is the amount of rotation.

Assuming that the force F is applied tangentially to the magnet ($\tau = F \cdot r_m$), the average mechanical force required was estimated to be ~300 N. Hence, as each magnet experiences about t=3.3 Nm, rotation of individual magnets could be achieved by commercially available rotary actuators. Rapid switching in the presence of large forces requires careful control of magnet rotation and an engineering design that minimizes mechanical (torsional) vibrations both in individual magnets and in the entire array.

Details of the measurement field $B_m$ will now be described. In this example, the measurement field $B_m$ was generated by two concentric cylindrical arrays comprising 12 magnets, each with the Halbach pattern. The simulations accounted for the presence of pre-polarisation array in the tangential configuration.

Figure 2A:
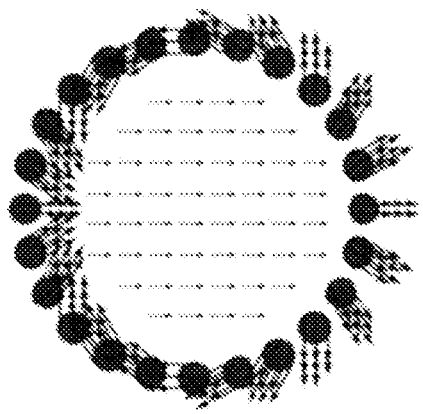
FIG. 2A is a schematic diagram of an example of a magnetic field generated by a pre-polarisation magnet array with pre-polarisation magnets in a first position defining a cylindrical Halbach array.
Figure 2B:
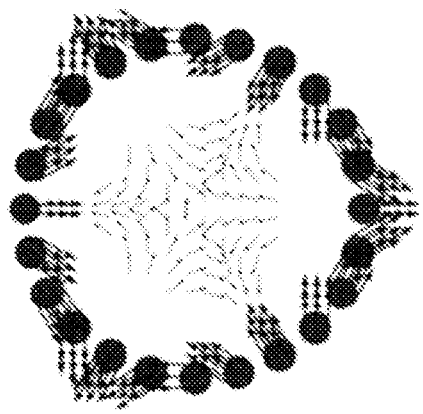
FIG. 2B is a schematic diagram of an example of a magnetic field generated by a pre-polarisation magnet array with pre-polarisation magnets in a second position defining a reverse cylindrical Halbach array.
Figure 2C:
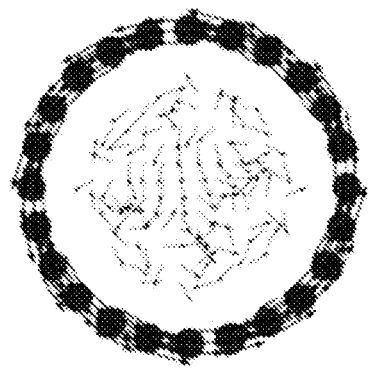
FIG. 2C is a schematic diagram of an example of a magnetic field generated by a pre-polarisation magnet array with pre-polarisation magnets in a tangential second position.
Figure 2D:
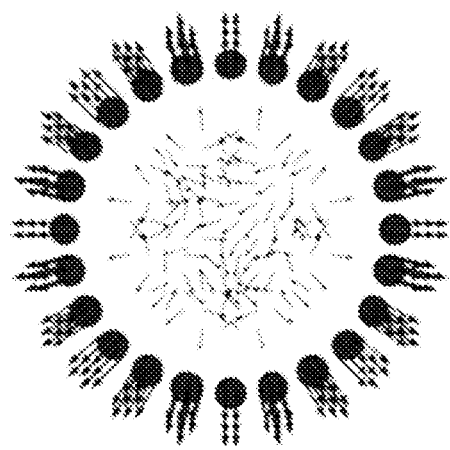
FIG. 2D is a schematic diagram of an example of a magnetic field generated by a pre-polarisation magnet array with pre-polarisation magnets in a radial second position.
Figure 13A:
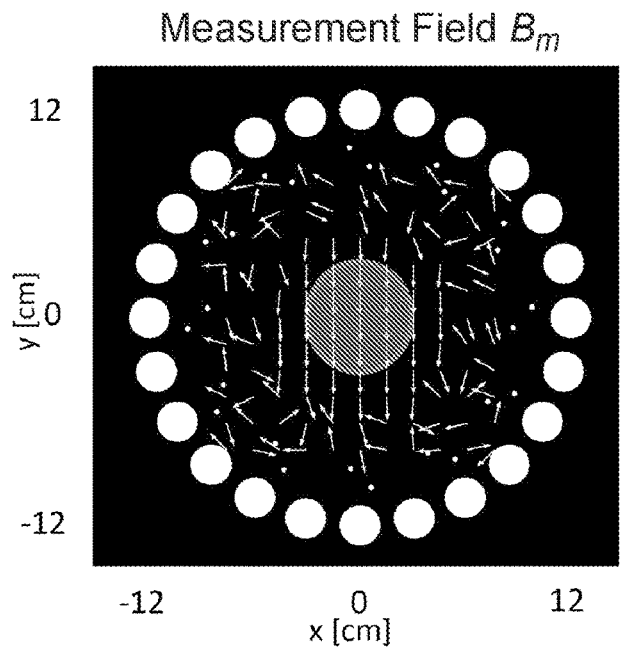
FIG. 13A is a schematic diagram of an example of the magnetic flux of the measurement field during measurement.

FIG. 13A shows an arrow plot of the magnetic field in the x-y plane at z=0 generated by pre-polarisation array with 24 magnets "switched off" i.e. in the tangential pattern shown in FIG. 2C and by the Halbach pattern of the first and second measurement arrays. The local field direction of the measurement field $B_m$ in the FOV was in the y-coordinate direction. The measurement field $B_m = 40$ µT was generated by rotating the first and second measurement arrays in opposite directions, each by an angle of α=4.5°.

Figure 13B:
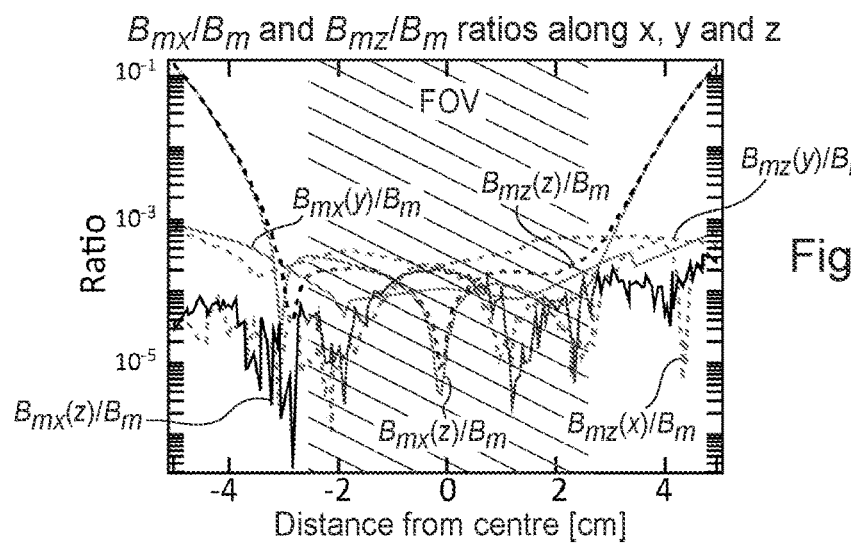
FIG. 13B is a graph showing a plot of an example of relative strengths of x and z components of the measurement field.

The directionality and homogeneity of the measurement field $B_m$ was evaluated by assessing the ratio of the minor field components ($B_{mx}$, $B_{mz}$ along x- and z) to the main component $B_m$ (along the y-coordinate direction), plotted in FIG. 13B, along the x- (solid line), y- (dash-dotted line) and z- (dashed line) axes. In all cases the minor components of the measurement field $B_m$ in the FOV were at least three orders of magnitude smaller than the main component.

Figure 13C:
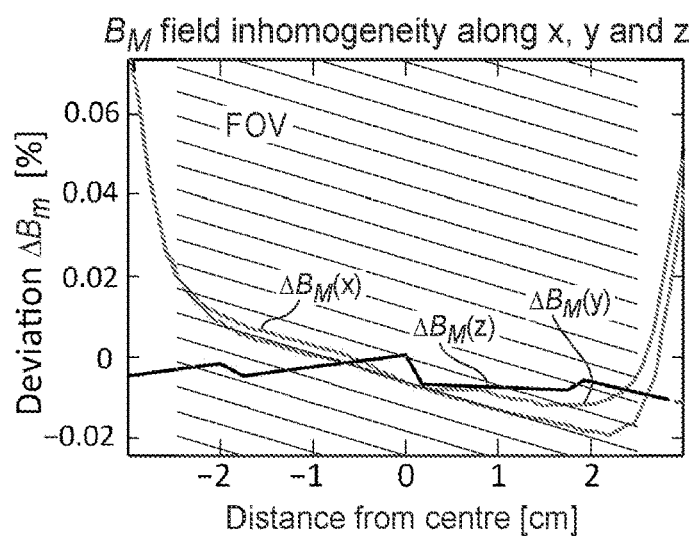
FIG. 13C is a graph showing a plot of an example of relative homogeneity of the measurement field.
Figure 14A:
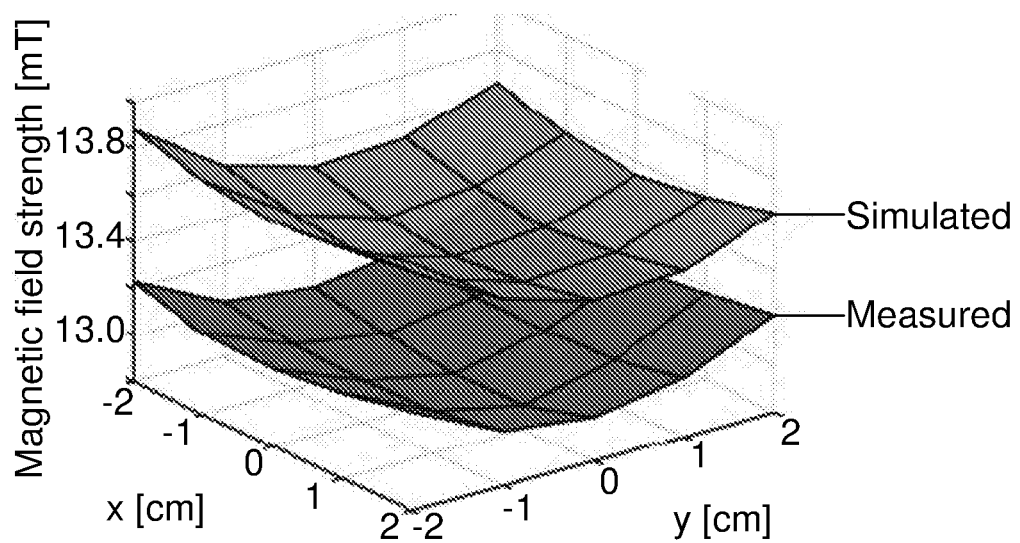
FIG. 14A is a graph showing a plot of an example of measured and simulated pre-polarisation fields; and, FIG. 14B is an arrow plot of an example of the measurement field for two different relative orientations of the measurement arrays.
Figure 14B:
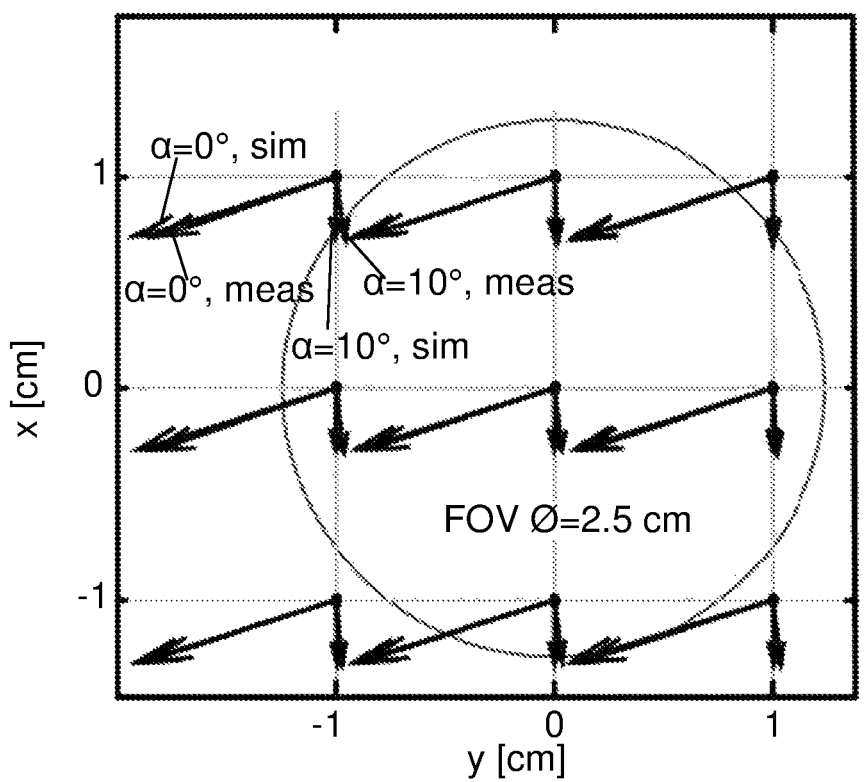

FIG. 13C shows detailed line plots of the measurement field $B_m$ along the x- (curve 1), y- (curve 2) and z-axes (curve 3) through the centre of the SPMA. Relative magnitude varied by less than 0.02% (200 ppm) within the FOV. The absolute magnetic field variation was around 8 nT ($B_m$=40 µT) corresponding to a line broadening in the NMR spectrum due to this field inhomogeneity of less than 0.2 Hz, according to equation 1.

For the chosen magnet characteristics (Ø=0.3 cm, L=70 cm and $B_r$=0.2 T), and rotation angles between 0 and 5°, this led to the measurement field $B_m$ values ranging between 0-50 µT. Precise rotations of the first and second measurement arrays are thus necessary to control the magnitude and direction of the measurement field $B_m$. A small mismatch of the rotation angles of the first and second measurement arrays could lead to a tilt from the defined axis of precession (y-axis) and the creation of an additional x-component in the measurement field $B_m$. This would result in a measurement field that is not perpendicular to sample magnetisation, resulting in a decrease in signal strength.

However, since the angles are relatively small, this effect is likely to be negligible. A misalignment of 0.5° of one array with the other arrays being correctly aligned resulted in a change in the magnitude of the measurement field $B_m$ from 55.4 µLT to 52.6 µT corresponding to a proton Larmor frequency change of 118 Hz. Field inhomogeneity was increased from 0.02% (200 ppm) to around 0.05% (500 ppm) on average in all three directions.

During an ULF experiment switching of the measurement field $B_m$ is not strictly necessary, since the pre-polarisation field $B_p$ is at least three orders of magnitude larger than the measurement field $B_m$. Therefore, the first and second measurement arrays can be carefully adjusted prior to experiments to minimize effects due to misalignment.

Magnetic fields of two arrays with different radii but the same number of identical magnets are difficult to match. Hence, in one preferred example, matching the first and second measurement arrays was achieved by reducing the individual magnet strength of the first measurement magnets $B_r$ from 0.2 T to 0.16 T for the magnets in the first (inner) measurement array. This is practical as rare earth magnets have a large range of standard remanent magnetisations.

A manually operated SPMA was built to demonstrate the generation, cancellation and regulation of $B_p$ and $B_m$. Like the SPMA for ULF relaxometry in the numerical study, the prototype consisted of three concentric arrays to generate the pre-polarisation field $B_p$, and the measurement field, $B_m$. The manually adjustable arrays were composed of ferrite permanent magnets of rectangular cross-section (ferrite grade Y30BH, Br=0.39 T, AMF Magnetics, Australia) chosen for their cost-effectiveness and availability and for simplicity of construction.

The pre-polarisation array had a radius R=15 cm and comprises 12 magnets (15L×2.5W×2.54H cm) equally spaced around the circumference achieving a fill factor of 0.32. The first measurement array includes 12 magnets (15L×1.2W×0.6H cm) with a radius $R_1$=10.5 cm, whilst the second measurement array includes 6 magnets (15L×1.2W× 0.6H cm) in an array radius $R_2$=7.5 cm, leading to fill factors of 0.16 and 0.11, respectively. For each array, the magnets were pressure-fitted in pairs of medium density fibreboard (MDF) rings that hold the ends of the bar magnets. The moderate magnetisation of the ferrite magnets allowed safe manual rotations of the arrays.

A Gaussmeter (F. W. Bell, Model 5080, Milwaukee, USA) mounted on a custom built 3-axis adjustable Cartesian holder was used to obtain magnetic field measurements in a grid (5×5×3 points in, x, y, z) covering the FOV (5×5×5 cm$^3$) for 2 different relative angular settings (α=0°, and 10°) of the first and second measurement arrays.

A comparison of measured and simulated pre-polarisation and measurement fields $B_p$, $B_m$ is shown in FIGS. 12A and 12B, with results summarised in Table 3 below.

TABLE 3

| Field | Measured | | Simulated | |
| --- | --- | --- | --- | --- |
| | Field strength [mT] | Field inhomogeneity | Field strength [mT] | Field inhomogeneity |
| Bp | 13.2 | 1% | 13.4 | 1% |
| Bm for α = +/−0° | 0.44 | 11% | 0.42 | 3% |
| Bm for α = +/−10° | 1.30 | 10% | 1.36 | 1% |

A non-zero magnitude of measurement field $B_m$=0.4 mT is present for α=0° because the magnetic field generated by each measurement array is not matched, hence the direction of the net measurement field $B_m$ is not parallel to the y-axis. The dependence of the net measurement field $B_m$ on the rotation angle α was correctly predicted by the simulations. However, a slight deviation was caused by the presence of a residual field generated by the pre-polarisation array for the tangential pattern of 70 µT compared to the simulated 1 µT, which may be due to uncompensated misalignment of individual magnets, variations in magnet dimensions or manufacturing imperfections which were not considered in the numerical model.

Further optimization of the manual SPMA (for instance, with shimming) and detailed field homogeneity evaluation were not attempted since the primary purpose was to demonstrate the switching capabilities of the pre-polarisation field $B_p$ and the adjustability of the measurement field $B_m$.

Low quality magnets in the prototype setup were also likely to have a strong effect on field homogeneity, with measured field inhomogeneity being higher in all configurations than for simulated fields. Discrepancies in the measurement field $B_m$ were higher than for the pre-polarisation field $B_p$, primarily due to the measurement magnets being closer to the FOV than the pre-polarisation magnets, resulting in greater sensitivity to variations. Additionally, the precision of the Gaussmeter (30 µT+1% of absolute scale) was lower for fields in the amplitude range of the measurement field $B_m$ than for the pre-polarisation field $B_p$.

Accordingly, the above described arrangements provide a small dynamic adjustable small permanent magnet array that can be used to generate multiple magnetic field configurations required for ULF NMR/MRI. As an advance on Halbach arrays, the SPMA enables magnetic fields to be generated through a combination of magnetisation patterns obtained by prescribed rotations of individual pivot-mounted permanent magnets and/or rotations of permanent magnets arrays.

For the generation of a pre-polarisation field, two magnetisation patterns were implemented, namely Halbach and tangential patterns, to generate and cancel the pre-polarisation field $B_p$. For the measurement field, two concentric arrays of permanent magnets were used to generate a variable measurement field $B_m$ suitable for use in ULF relaxometry at different frequencies. This would allow physical processes to be studied as a function of frequency.

Simulation with 24 permanent magnets (L=70 cm, dm=2.16 cm and $B_r$=1 T) predicted pre-polarisation field magnitudes above 100 mT for the SPMA, higher than presently achieved in ULF instruments using resistive coil technology. The simulation also predicted a magnetic field inhomogeneity for the pre-polarisation field $B_p$ of less than 0.03% (300 ppm) within a field of FOV of 5×5×5 cm$^3$. The SPMA field homogeneity represents an improvement on existing systems, leading to higher and more homogeneous sample pre-polarisation, which in turn should increase SNR.

Variable measurement fields ranging from near zero to 50 µT were generated by small rotations of two concentric cylindrical Halbach measurement arrays with the outer pre-polarisation array in a tangential pattern. Nominal magnitude deviations were below 0.02% or 200 ppm without shimming, which is equivalent to spectral line broadening of less than 0.2 Hz for proton Larmor frequencies at ULF. Broadening (which limits resolution) relates to absolute field inhomogeneity. Narrower spectral lines but with lower amplitude can be observed at ULF compared to high field NMR. For example, 300 ppm inhomogeneity at measurement field $B_m$=50 µT results in line width broadening equivalent to 0.015 ppm inhomogeneity at measurement field $B_m$=1 T.

It will be appreciated that in the above described arrangements precise rotational adjustments of the pre-polarisation magnets and/or measurement arrays can help achieve high field homogeneity and accurate control of the resulting fields.

As the measurement field $B_m$ does not need to be switched off during an experiment, as its magnitude is at least three orders of magnitude lower than the pre-polarisation field $B_p$, this simplifies the design of motion controllers and facilitates adjustments to enhance field homogeneity. Switching off the pre-polarisation field $B_p$ rapidly can minimise transitional fields, thereby helping maintain polarisation of the sample prior to measurement. This can be achieved using an actuator system, and in particular an actuator that can synchronously control movement such as the SHA25A-81 (Harmonic Drive, Mass., USA).

The arrangement can achieve fast switching between the pre-polarisation and measurement states, which is comparable to current ULF instruments using resistive coils and customized switch boxes.

Unlike resistive coils, energy is not dissipated into heat due to current flow, obviating sample heating. Furthermore, undesired signal generation due to transient currents, induced in conductors by rapid switching, is reduced because the conductivity of magnet alloys is much lower than for conductors like copper used in coils. Compared to superconducting magnets, the energy consumption of the SPMA is significantly lower because cooling is not required, further reducing cost.

While the above description has focused on the use of the SPMA for ULF NMR relaxometry, the flexible and modular design of the SPMA allows additional magnet arrays to be added, for instance, to generate the dynamic gradient fields required for imaging with ULF-MRI. This is achievable since the absolute field homogeneity requirements for ULF instrumentation are quite moderate. Notably, other than the switching between the pre-polarisation and measurement fields $B_p$, $B_m$ with the SPMA, sequences for signal generation and acquisition are similar to conventional approaches with instrumentation using resistive magnets. Measurement strategies like iterative sample pre-polarisation to enhance signal-to-noise ratio through signal averaging can be applied with the SPMA similar to high field relaxometry applications.

Thus the above described SPMA is substantially different from traditional resistive coil-based approaches and allows flexible manipulation of the magnetic field while achieving very high field homogeneities through rearrangement of a concentric SPMA. Pre-polarisation and measurement fields relevant for ULF NMR could be generated by a combination of rotation of individual permanent magnets and rotation of Halbach arrays.

Throughout this specification and claims which follow, unless the context requires otherwise, the word "comprise", and variations such as "comprises" or "comprising", will be understood to imply the inclusion of a stated integer or group of integers or steps but not the exclusion of any other integer or group of integers. As used herein and unless otherwise stated, the term "approximately" means±20%.

Persons skilled in the art will appreciate that numerous variations and modifications will become apparent. All such variations and modifications which become apparent to persons skilled in the art, should be considered to fall within the spirit and scope that the invention broadly appearing before described.

The claims defining the invention are as follows:

1. A magnet system for use in a low field magnetic resonance process, the system including:
   a) a pre-polarization magnet arrangement for generating a pre-polarization field, the pre-polarising magnet arrangement including a pre-polarization field array including a plurality of permanent pre-polarization magnets mounted in a support and provided in a circumferentially spaced arrangement surrounding a field of view, a number of the pre-polarization magnets being rotatable between respective first and second positions, wherein:
      i) in the first position the pre-polarization magnets are configured as a cylindrical Halbach array to generate a pre-polarization field in the field of view; and,
      ii) in the second position the pre-polarization magnets are configured to minimize a field in the field of view; and,
   b) a measurement magnet arrangement for generating a measurement field,
      wherein the measurement magnet arrangement includes:
         a first measurement array including a plurality of permanent first measurement magnets mounted in a first support in a circumferentially spaced arrangement and configured to generate a first field in a field of view, the first field being orientated in a first direction relative to the first support; and
         a second measurement array including a plurality of permanent second measurement magnets mounted in a second support in a circumferentially spaced arrangement and configured to generate a second field in the field of view, the second field being orientated in a second direction relative to the second support, wherein the first and second supports are concentrically arranged about a field of view so that first and second measurement arrays can be relatively rotated allowing a strength of a measurement field in the field of view to be controlled,
      wherein:
         when the first and second directions are in opposition a measurement field in the field of view is minimized; and,
         when the first and second directions are at least partially aligned with a measurement field direction, a net measurement field is generated extending in the measurement field direction, with the strength of the measurement field being controlled by a degree of alignment of the first and second directions.

2. A magnet system according to claim 1, wherein:
 a) the pre-polarization magnet arrangement generates a pre-polarization field having a pre- polarization field direction perpendicular to the array axis; and,
 b) the measurement magnet arrangement generates a measurement field having a measurement field direction perpendicular to the array axis and the pre-polarization field direction.

3. A magnet system according to claim 1, wherein the measurement magnet arrangement includes at least one measurement field array mounted at least one of:
 a) radially outwardly of the support; and,
 b) radially inwardly of the support.

4. A magnet system according to claim 1, wherein the first and second measurement arrays are configured as respective cylindrical Halbach arrays.

5. A magnet system according to claim 1, wherein the measurement magnet arrangement includes mechanical coupling between the first and second measurement arrays so that the first and second measurement arrays are rotated synchronously in opposing directions.

6. A magnet system according to claim 1, wherein the measurement magnet arrangement includes a measurement actuator system for relatively rotating the first and second permanent magnet arrays.

7. A magnet system according to claim 6, wherein the measurement actuator system includes a drive member and a mechanical linkage coupling that rotates at least one of the first and second supports.

8. A magnet system according to claim 1, wherein the first and second supports include respective annular cylindrical support bodies having support body axes coincident with a field of view axis and wherein the measurement field direction is perpendicular to a pre-polarization field direction and the field of view axis.

9. A magnet system according to claim 1, wherein:
 a) the measurement magnets are elongate bar magnets extending parallel to a field of view axis of the field of view and with poles orientated perpendicularly to the field of view axis; and,
 b) the measurement magnets have a cross-sectional area of at least 0.5 cm$^2$ and a length of at least 10 cm and a remnant field strength of at least 0.1.

10. A magnet system according to claim 1, wherein each measurement magnet array has a plurality of magnets numbering at least 12 magnets and a measurement magnet array radius of less than 30 cm.

11. A magnet system according to claim 1, wherein the measurement field has a strength adjustable between 0 μT and 0.01 T and a field homogeneity of greater than 200 ppm.

* * * * *